US012683505B2

(12) United States Patent
Esteve et al.

(10) Patent No.: US 12,683,505 B2
(45) Date of Patent: Jul. 14, 2026

(54) PULSE WIDTH MODULATION CIRCUIT CONFIGURED TO CONTROL A POWER TRANSISTOR OF A SWITCHED-MODE POWER SUPPLY

(71) Applicant: STMicroelectronics International N.V., Geneva (CH)

(72) Inventors: Lionel Esteve, Coudoux (FR); Loic Bourguine, Chateauneuf le rouge (FR)

(73) Assignee: STMicroelectronics International N.V., Geneva (CH)

( * ) Notice: Subject to any disclaimer, the term of this patent is extended or adjusted under 35 U.S.C. 154(b) by 175 days.

(21) Appl. No.: 18/591,480

(22) Filed: Feb. 29, 2024

(65) Prior Publication Data

US 2024/0305203 A1    Sep. 12, 2024

(30) Foreign Application Priority Data

Mar. 8, 2023   (FR) ........................................ 2302129
Mar. 8, 2023   (FR) ........................................ 2302132

(51) Int. Cl.
H02M 3/335        (2006.01)
H02M 1/08         (2006.01)
(Continued)

(52) U.S. Cl.
CPC ......... H02M 3/33515 (2013.01); H02M 1/08 (2013.01); H02M 3/33523 (2013.01);
(Continued)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225;
(Continued)

(56) References Cited

U.S. PATENT DOCUMENTS 4,952,865 A    8/1990  Pataut et al.
5,444,219 A    8/1995  Kelly
(Continued)

FOREIGN PATENT DOCUMENTS

CN    212210843 U    12/2020
CN    114756078 A    7/2022
(Continued)

OTHER PUBLICATIONS

U.S. Appl. No. 18/485,184, filed Oct. 11, 2023.
(Continued)

*Primary Examiner* — Jeffrey A Gblende
(74) *Attorney, Agent, or Firm* — Seed Intellectual Property Law Group LLP

(57)        ABSTRACT

The present disclosure relates to a pulse width modulation circuit of a switched-mode power supply formed in and on a monolithic semiconductor substrate with a face coated with a gallium nitride layer, said circuit being adapted to control a power transistor of said switched-mode power supply.

19 Claims, 17 Drawing Sheets

(51) Int. Cl.
| | |
|---|---|
| *H10D 8/25* | (2025.01) |
| *H10D 30/47* | (2025.01) |
| *H10D 62/85* | (2025.01) |

(52) U.S. Cl.
CPC ............. *H10D 8/25* (2025.01); *H10D 30/475* (2025.01); *H10D 62/8503* (2025.01)

(58) Field of Classification Search
CPC ......... G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069
See application file for complete search history.

(56) References Cited

U.S. PATENT DOCUMENTS

| | | | |
|---|---|---|---|
| 7,773,393 B2 | 8/2010 | Choi | |
| 8,653,742 B2 * | 2/2014 | Kikuchi | H05B 45/10 |
| | | | 315/307 |
| 9,577,530 B1 | 2/2017 | Ribarich et al. | |
| 9,590,615 B1 * | 3/2017 | Hayakawa | H02M 3/33507 |
| 9,647,476 B2 | 5/2017 | Kinzer et al. | |
| 9,742,393 B2 | 8/2017 | Pavao-Moreira et al. | |
| 9,831,867 B1 | 11/2017 | Kinzer et al. | |
| 9,929,652 B1 | 3/2018 | Ribarich et al. | |
| 10,008,884 B2 | 6/2018 | Zhang | |
| 10,097,100 B1 | 10/2018 | Xue et al. | |
| 10,446,542 B1 | 10/2019 | Kinzer | |
| 10,996,696 B2 | 5/2021 | Inoue | |
| 11,121,704 B2 | 9/2021 | Kaya et al. | |
| 11,558,047 B2 * | 1/2023 | Strijker | H03K 17/165 |
| 11,770,010 B2 | 9/2023 | Kinzer et al. | |
| 12,218,589 B2 * | 2/2025 | Hu | H02M 1/0025 |
| 2005/0133855 A1 | 6/2005 | Graf | |
| 2011/0234255 A1 | 9/2011 | Chobot | |
| 2013/0265683 A1 | 10/2013 | Gueltig | |
| 2014/0071714 A1 | 3/2014 | Li | |
| 2016/0049786 A1 | 2/2016 | Kinzer | |
| 2016/0056721 A1 | 2/2016 | Kinzer | |
| 2016/0099647 A1 | 4/2016 | Zhang et al. | |
| 2016/0301408 A1 | 10/2016 | Roberts et al. | |
| 2016/0372920 A1 | 12/2016 | Kinzer et al. | |
| 2017/0162483 A1 | 6/2017 | Kinzer | |
| 2017/0163258 A1 | 6/2017 | Kinzer et al. | |
| 2017/0194237 A1 | 7/2017 | Kinzer | |
| 2017/0222644 A1 | 8/2017 | Kinzer et al. | |
| 2018/0026531 A1 | 1/2018 | Nagda et al. | |
| 2019/0123740 A1 | 4/2019 | Chern et al. | |
| 2021/0044286 A1 | 2/2021 | Kaufmann et al. | |
| 2021/0372859 A1 | 12/2021 | Chern et al. | |
| 2022/0200590 A1 | 6/2022 | Ramond | |
| 2022/0208761 A1 * | 6/2022 | Udrea | H10D 84/86 |
| 2022/0310469 A1 | 9/2022 | Liao et al. | |
| 2023/0396158 A1 * | 12/2023 | Huang | H05K 1/181 |
| 2024/0136350 A1 | 4/2024 | Bourguine et al. | |
| 2024/0136351 A1 | 4/2024 | Bourguine et al. | |
| 2024/0136424 A1 | 4/2024 | Bourguine | |
| 2024/0136433 A1 | 4/2024 | Bourguine et al. | |

FOREIGN PATENT DOCUMENTS

| | | |
|---|---|---|
| EP | 0702455 A2 | 3/1996 |
| FR | 2641127 A1 | 6/1990 |

OTHER PUBLICATIONS

U.S. Appl. No. 18/485,190, filed Oct. 11, 2023.
U.S. Appl. No. 18/485,194, filed Oct. 11, 2023.
U.S. Appl. No. 18/485,201, filed Oct. 11, 2023.
Boutros et al., "GaN Power Electronics for Automotive Applications," IEEE Energytech, May 29, 2012, pp. 1-4.
"Gallium nitride," Wikipedia, retrieved from https://en.wikipedia.org/w/index.php?title=Gallium_nitride&oldid=879521224, Dec. 1, 2022, 1 page.

* cited by examiner

300

(A)

350

(B)

PULSE WIDTH MODULATION CIRCUIT CONFIGURED TO CONTROL A POWER TRANSISTOR OF A SWITCHED-MODE POWER SUPPLY

CROSS-REFERENCE TO RELATED APPLICATION(S)

This application claims the priority benefit of French patent application number FR2302129, filed on Mar. 8, 2023, entitled "Circuit de modulation en largeur d'impulsion," which is hereby incorporated by reference to the maximum extent allowable by law.

This application claims the priority benefit of French patent application number FR2302132, filed on Mar. 8, 2023, entitled "Circuit de detection d'un court-circuit," which is hereby incorporated by reference to the maximum extent allowable by law.

BACKGROUND

Technical Field

The present disclosure relates generally to the electronic systems and devices, and more particularly to the electronic systems and devices formed from a structure of gallium nitride (GaN). The present disclosure more particularly relates to power switch formed from a structure of gallium nitride (GaN) and used in a switched-mode power supply.

Description of the Related Art

It is usual to form electronic systems and devices from silicon substrate, but other semiconductor material may be used. Particularly, structures comprising gallium nitride (GaN) may be used.

BRIEF SUMMARY

It would be desirable to be able to improve at least in part some aspects of the electronic systems and devices formed from, on, and in structures comprising gallium nitride.

There is a need for electronic systems and devices formed in and on structures comprising gallium nitride.

There is a need for electronic systems and devices comprising transistors formed in and on structures including gallium nitride.

One embodiment address all or some of the drawbacks of the known electronic systems and devices.

According to a first aspect, an embodiment provides a pulse width modulation circuit of a switched-mode power supply formed in and on a monolithic semiconductor substrate with a face coated with a gallium nitride layer, said circuit being adapted to control a power transistor of said switched-mode power supply.

According to an embodiment, the circuit includes a first comparator circuit of a first voltage representative of a drain current of said transistor and of a feedback current of said switched-mode power supply.

According to an embodiment, said first comparator circuit is adapted to cause said transistor non-conductive if said first voltage is higher than a first threshold voltage.

According to an embodiment, the circuit further includes a second comparator circuit of said first voltage representative of the drain current of said transistor and of a feedback current of said switched-mode power supply.

According to an embodiment, said second comparator circuit is adapted to cause said transistor non-conductive if said first voltage is lower than a second threshold voltage.

According to an embodiment, the circuit further includes a first filtering circuit allowing a result of said second comparator circuit to be taken into account only during a non-conduction phase of said power transistor.

According to an embodiment, the circuit further includes a third comparator circuit of said first voltage representative of the drain current of said transistor and of a feedback current of said switched-mode power supply.

According to an embodiment, said third comparator circuit is adapted to cause said transistor non-conductive if said first voltage is higher than a third threshold voltage.

According to an embodiment, the circuit further includes a second filtering circuit allowing a result of said third comparator circuit to be taken into account only during a non-conduction phase of said power transistor.

According to an embodiment, the circuit further includes an oscillating circuit adapted to provide a clock voltage.

According to an embodiment, the circuit further includes a logic circuit adapted to receive at least one clock voltage, and at least one comparison voltage.

According to an embodiment, the circuit further includes a driving circuit of said power transistor adapted to receive a control voltage from said logic circuit.

An embodiment provides a power switch including a power transistor adapted to receive a maximum voltage of 650 V between its drain and its source, and a pulse width modulation circuit as previously described.

According to an embodiment, said power transistor is a transistor of the HEMT type of e-mode type.

An embodiment provides a switched-mode power supply including the power switch as previously described.

An embodiment provides a circuit for detecting a shorting at an output of a switched-mode power supply, formed in and on a monolithic semiconductor substrate with a face coated with a gallium nitride layer, said circuit being adapted to control a power transistor of said switched-mode power supply.

According to an embodiment, the circuit includes a circuit comparator of a first voltage representative of a drain current of said transistor and of a feedback current of said switched-mode power supply.

According to an embodiment, said comparator circuit is adapted to cause said transistor non-conductive if said first voltage is lower than a second threshold voltage.

According to an embodiment, the circuit further includes a first filtering circuit allowing a result of said second comparator circuit to be taken into account only during a non-conduction phase of said power transistor.

According to an embodiment, the circuit further includes an oscillating circuit adapted to deliver a low frequency clock voltage.

Another embodiment provides a pulse width modulation circuit including a circuit for detecting a shorting as previously described.

According to an embodiment, the circuit further includes a logic circuit adapted to receive a comparison voltage supplied by said detection circuit.

According to an embodiment, the circuit further includes a driving circuit of said power transistor adapted to receive a control voltage from said logic circuit.

An embodiment provides a power transistor including a power transistor adapted to receive a maximum voltage of 650 V between its drain and its source, and a pulse width modulation circuit as previously described.

According to an embodiment, said power transistor is a transistor of the HEMT type of e-mode type.

An embodiment provides a switched-mode power supply including the power switch as previously described.

BRIEF DESCRIPTION OF THE SEVERAL VIEWS OF THE DRAWINGS

Foregoing features and advantages, as well as others, will be described in detail in the following description of specific embodiments given by way of illustration and not limitation with reference to the accompanying drawings, in which.

4

Figure 4:
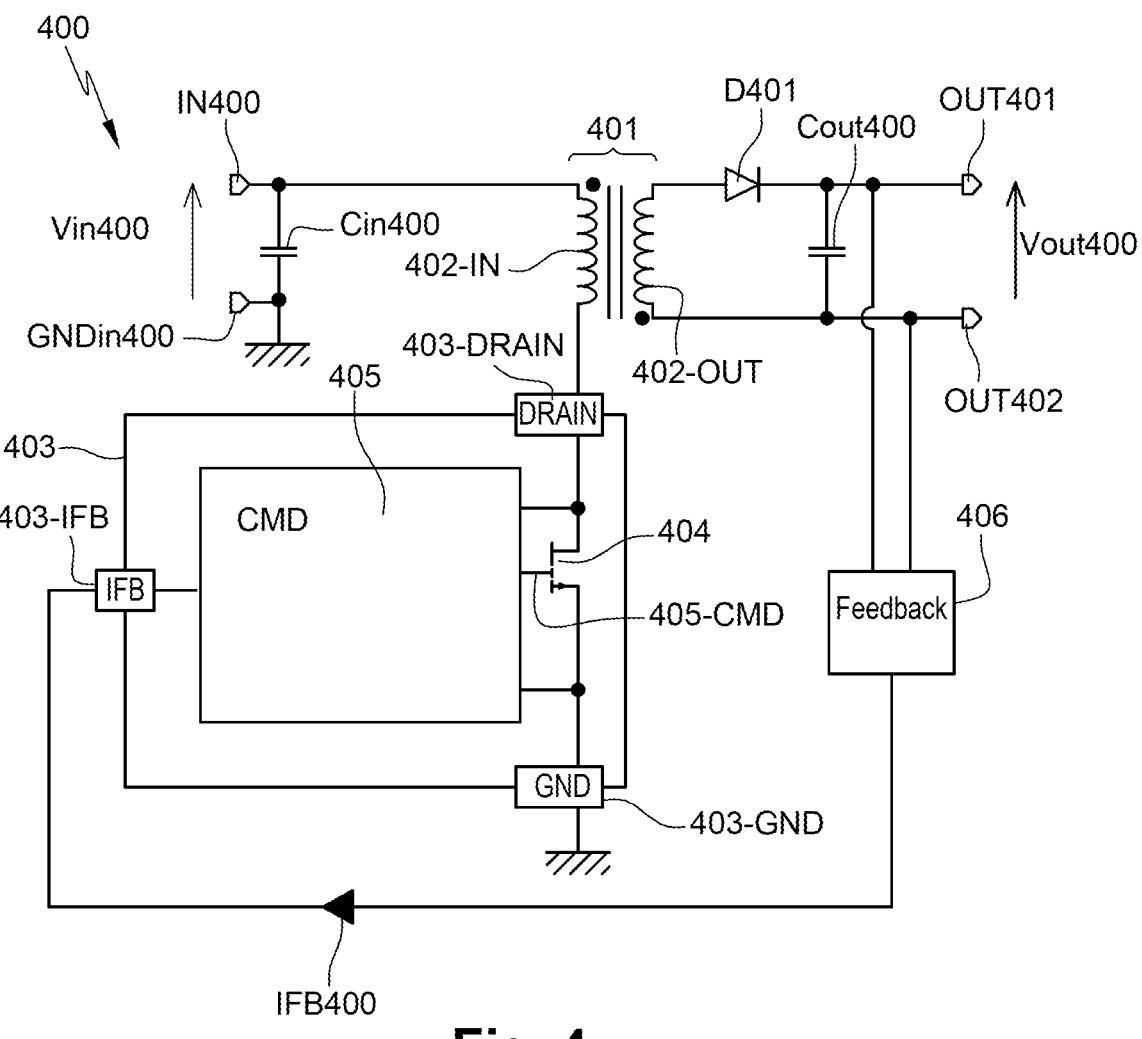
FIG. 4 schematically and partly in block form illustrates a part of a switched-mode power supply including an embodiment of an electronic device formed in and on a structure including gallium nitride.
Figure 5:
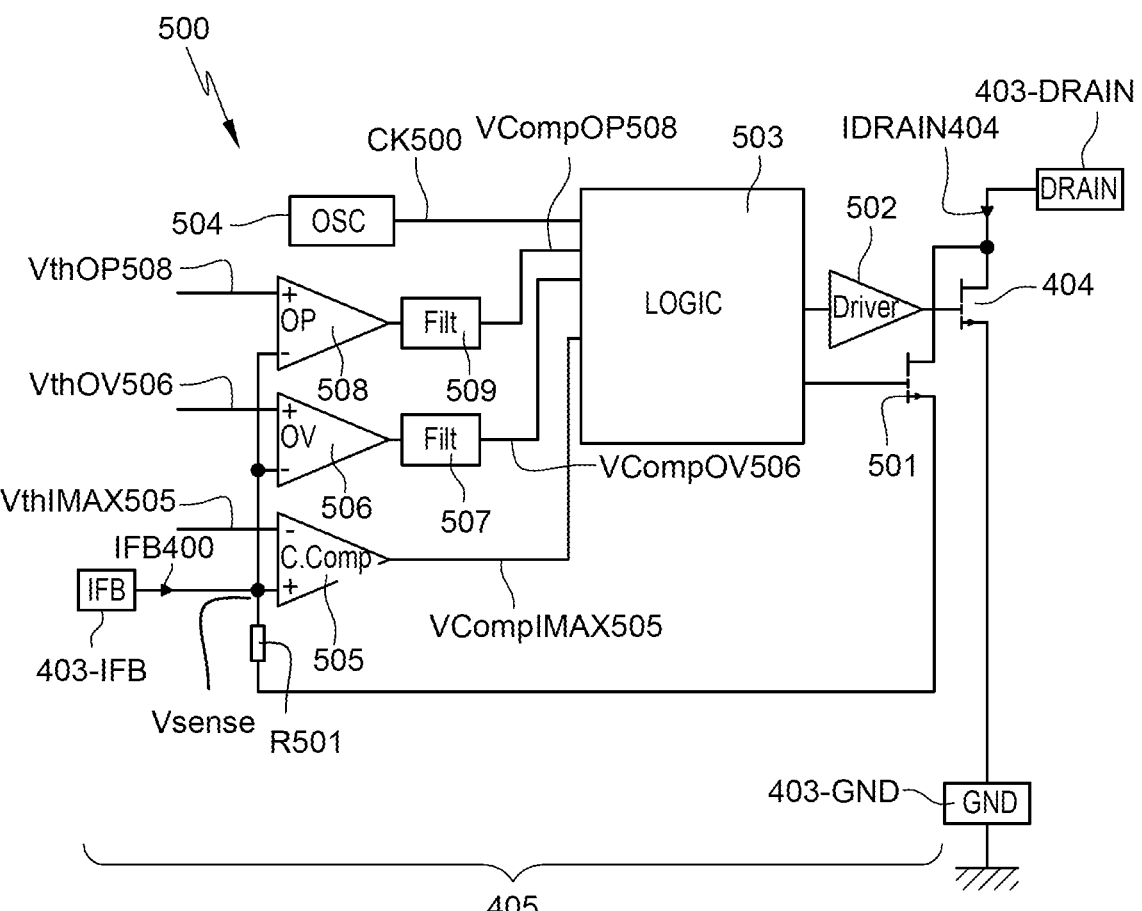
FIG. 5 schematically illustrates in block form a more detailed electric scheme of an embodiment of a power switch of the switched-mode power supply of FIG. 4.
Figure 23:
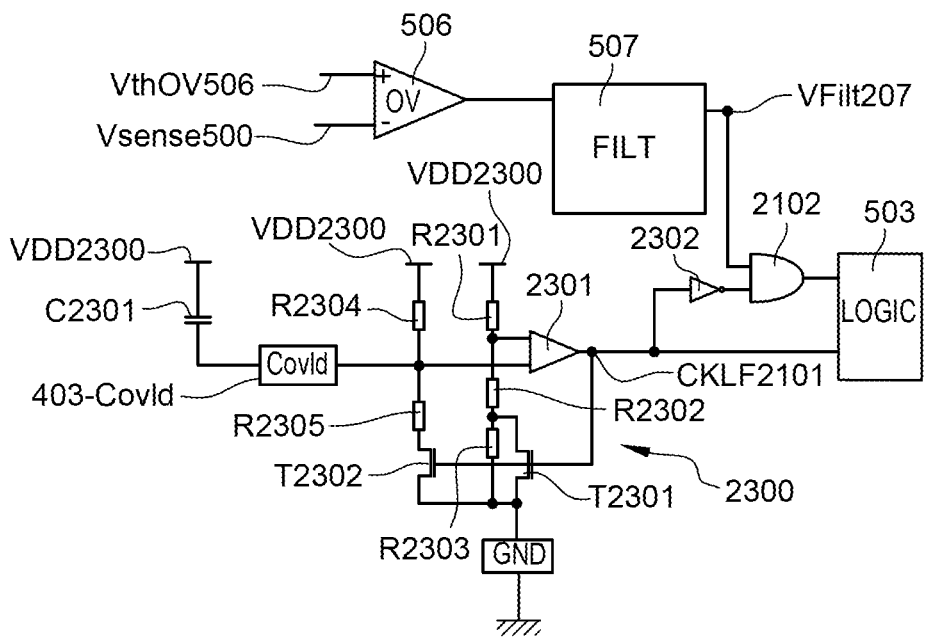
FIG. 23 illustrates in more detail a part of the embodiment of the circuit for detecting an output shorting of FIG. 21.
Figure 24:
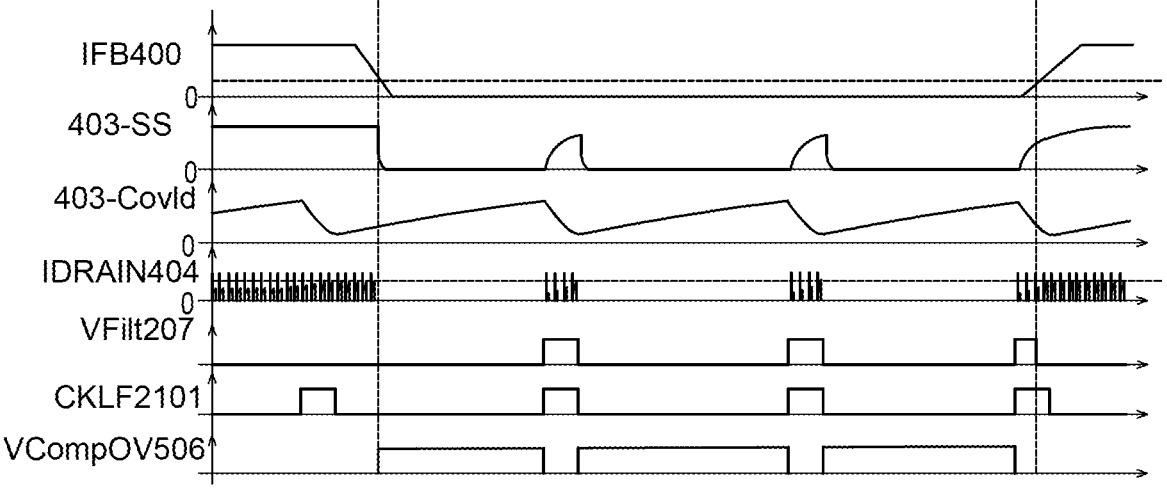
Figure 25:
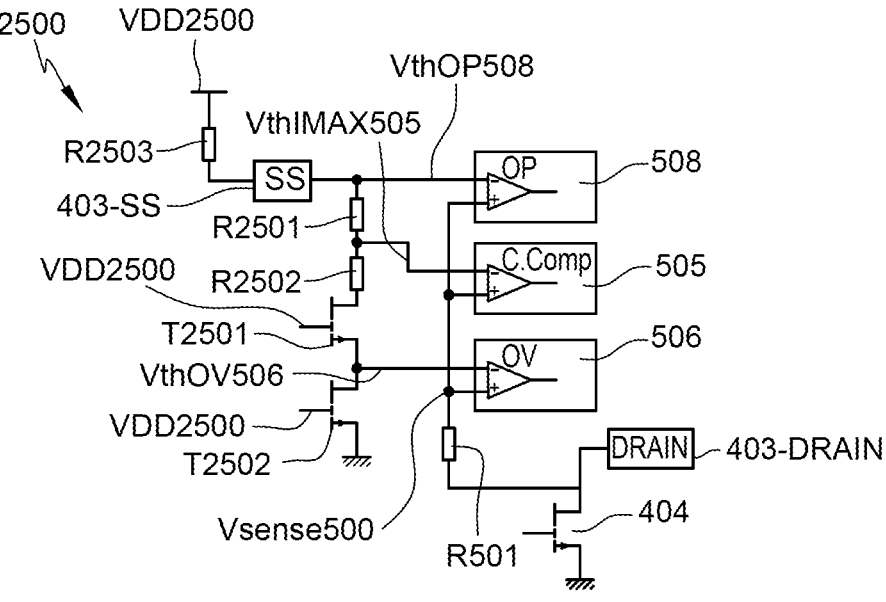
Figure 26:
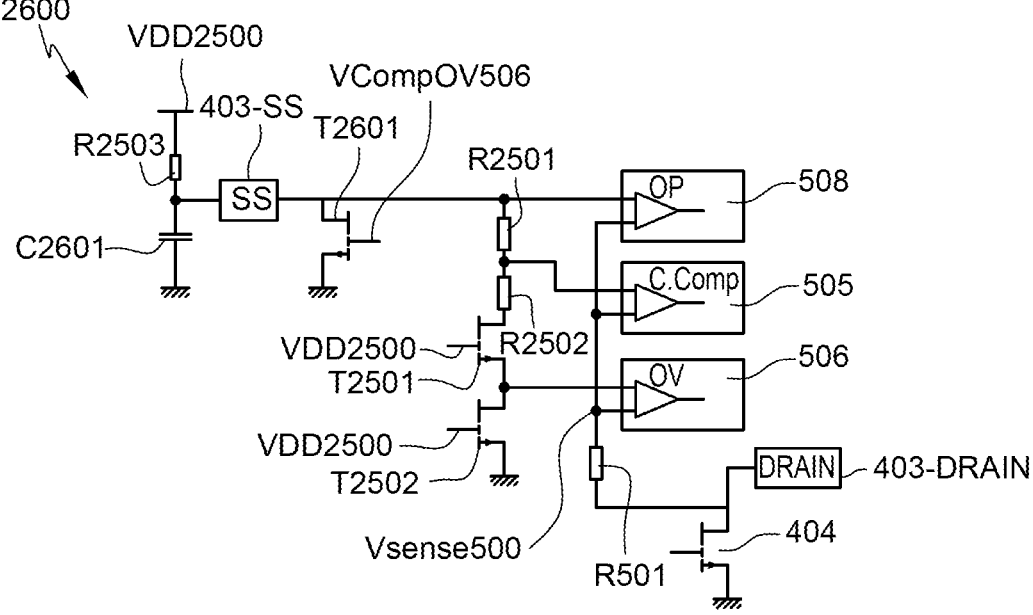
Figure 27:
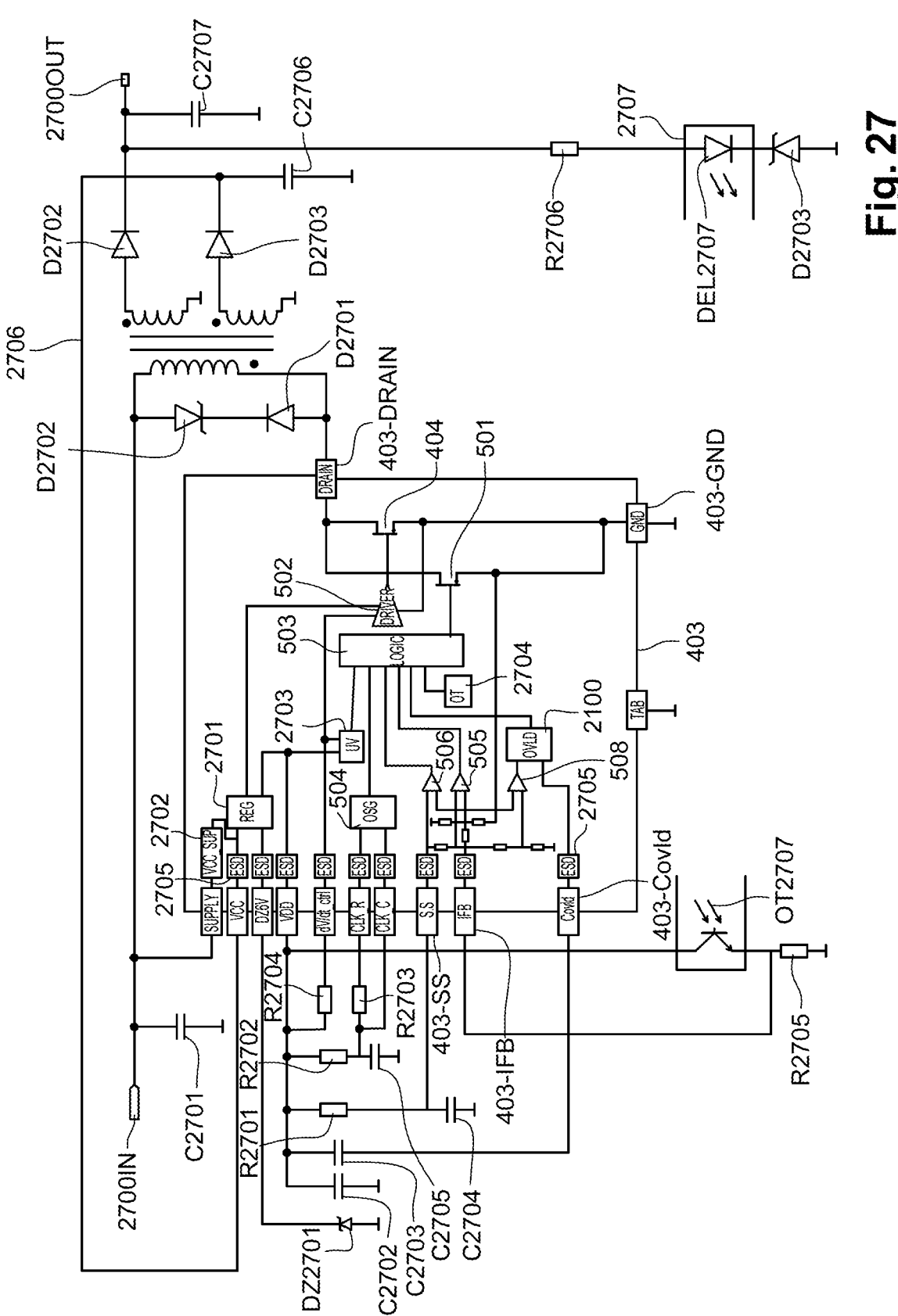

FIG. 24 illustrates time diagrams representing the operation of a part of the embodiment of the circuit for detecting an output shorting of FIG. 23, and particularly the principle of power limiting of the detection of a shorting at an output and the associated rebooting;

FIG. 25 illustrates a first embodiment of a circuit for generating threshold voltages of the embodiment of FIG. 5;

FIG. 26 illustrates a second embodiment of a circuit for generating the threshold voltages of the embodiment of FIG. 5; and FIG. 27 illustrates a more detailed example embodiment of the embodiment of FIG. 4.

DETAILED DESCRIPTION

Like features have been designated by like references in the various Figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "hereinafter," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
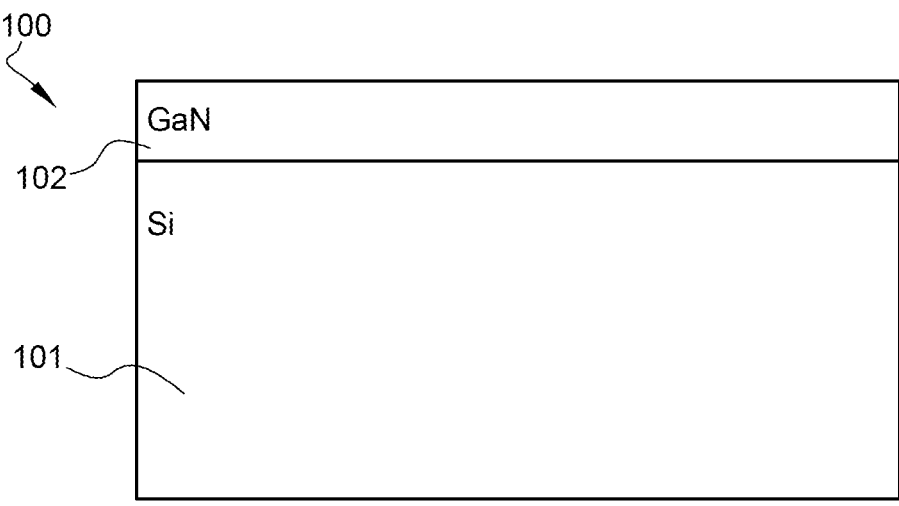
FIG. 1 schematically illustrates a structure including gallium nitride.

FIG. 1 is a cross-sectional view schematically illustrating a semiconductor structure 100 including gallium nitride.

Structure 100 is generally constituted of a substrate 101 (Si) made of a semiconductor material, for example a silicon substrate, covered on one of its face by a layer 102 (GaN) made of gallium nitride (GaN). The layer 102 is between 0.5 and 5 $\mu$m thick.

When the structure 100 is used as the basis of an electronic system or device, electronic components are formed in and on the layer 102. Metallization levels may further be formed on the layer 102.

Figure 2:
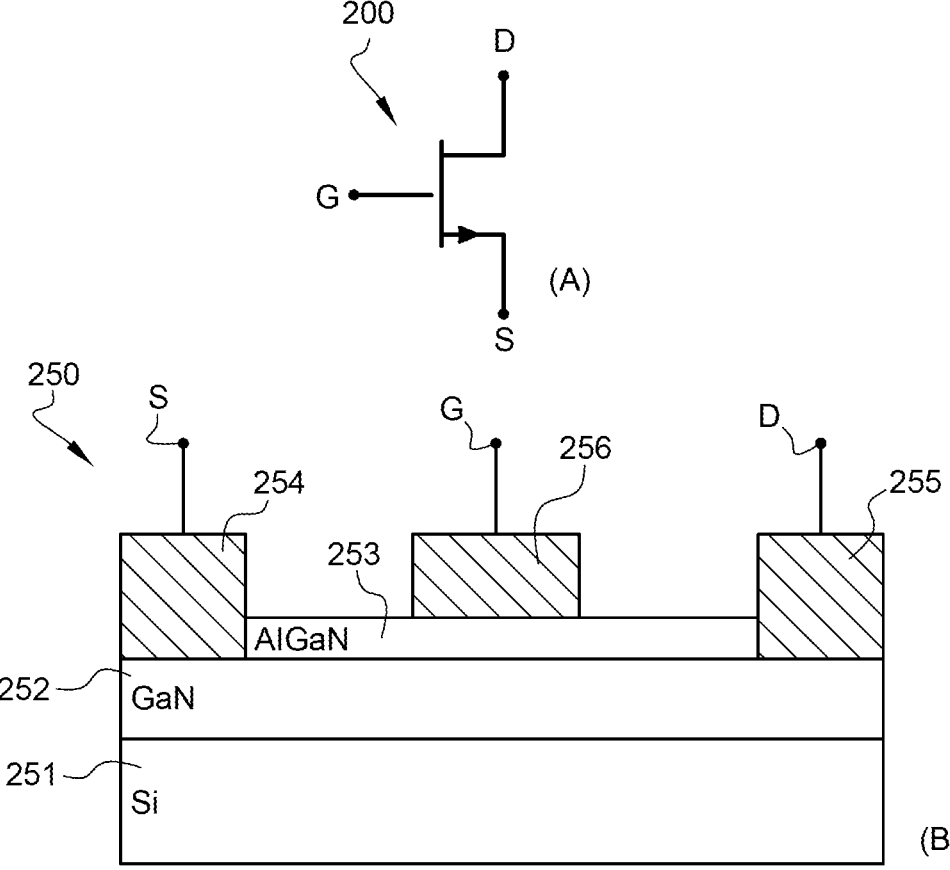
FIG. 2 includes two views (A) and (B) illustrating a first type of transistor formed in and on a structure including gallium nitride.

FIG. 2 includes two views (A) and (B) illustrating a first type of transistor 200 formed in a structure including gallium nitride. The view (A) illustrates an electric scheme of the transistor 200, and the view (B) illustrates a cross-sectional view of a structure 250 forming the transistor 200.

Transistor 200 is a High Electron Mobility Transistor (HEMT), also called modulated-doping field effect transistor (MODFET). Hereinafter a high electron mobility transistor is designated as transistor HEMT.

A transistor HEMT, as the transistor 200, includes a gate terminal, referenced G in FIG. 2, a source terminal, referenced S in FIG. 2, and a drain terminal, referenced D in FIG. 2.

In addition, the transistor 200 is a HEMT transistor with depletion mode, herein after called HEMT transistor of d-mode type, or d-mode transistor. According to another designation, the transistor 200 is a HEMT transistor of normally-ON type, or normally-ON HEMT transistor. The electric scheme of the transistor 200 shown in the view (A) is the electric scheme that will be used in all the following Figures to illustrate a d-mode or normally-ON transistor.

Practically, the transistor 200 may be obtained by a structure 250 formed from a structure of the type of the structure 100 described in relation with FIG. 1. Thus, the structure 250 includes a substrate 251 (Si) made of a conductive material, such as silicon, a face of which is covered by a layer 252 (GaN) made of gallium nitride. The layer 252 made of gallium nitride is partially covered by a layer 253 (AlGaN) made of gallium-aluminum nitride. A connection terminal 254 constitutes the source contact pad S of the transistor 200. The connection terminal 254 is formed on a portion of the layer 252 that is not covered by the layer 253. A connection terminal 255 constitutes the drain contact pad D of the transistor 200. The connection terminal 255 is formed on a portion of the layer 252 that is not covered by the layer 253. A connection terminal 256 constitutes the gate contact pad G of the transistor 200. The connection terminal 256 is formed on a portion of the layer 253, and is not disposed between the connecting pads 254 and 255.

Operation of the transistor 200 is as follows. When the gate G of the transistor 200 is let floating, or a positive voltage is applied between its gate G and its source S, the transistor 200 is turned ON or conductive, hence its designation as a normally ON transistor. In order to "close" the transistor 200, i.e., turn it non-conductive, a negative voltage should be applied between its gate G and its source S.

Figure 3:
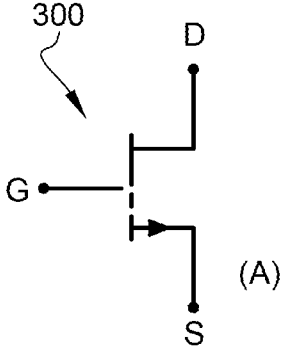
FIG. 3 includes two views (A) and (B) illustrating a second type of transistor formed in a structure including gallium nitride.
Figure 3:
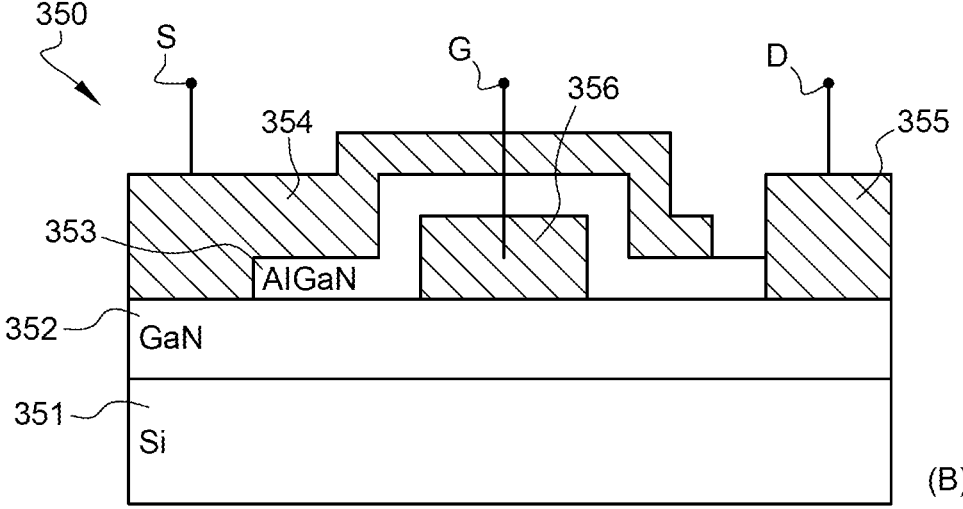

FIG. 3 includes two views (A) and (B) illustrating a second type of transistor 300 formed in a structure including gallium nitride. The view (A) illustrates an electric scheme of the transistor 300, and view (B) illustrates a cross-sectional of a structure 350 forming the transistor 300.

Like the transistor 200 described in relation with FIG. 2, the transistor 300 is a high electron mobility transistor, or HEMT transistor. Transistor 300 includes a gate terminal, referenced G in FIG. 3, a source terminal, referenced S in FIG. 3, and a drain terminal, referenced D in FIG. 3.

Moreover, and opposite to the transistor 200 of FIG. 2, the transistor 300 is an HEMT transistor with enhancement mode, hereinafter called e-mode type HEMT transistor, or e-mode transistor. According to another designation, the transistor 300 is a HEMT transistor of normally-OFF type, or normally-OFF HEMT transistor, or normally-OFF transistor. The electrical scheme of the transistor 300 shown in view (A) is the electrical scheme that will be used in all the following Figures to illustrate an e-mode or normally-OFF transistor.

Practically, the transistor 300 may be obtained for a structure 350 formed from a structure of the type of the structure 100 described in relation with FIG. 1. Thus, the structure 350 includes a substrate 351 (Si) made of a conductive material, such as silicon, a face of which is covered with a layer 352 (GaN) made of gallium nitride. The gallium nitride layer 352 is partly covered with an aluminum-gallium nitride layer 353 (ALGaN). A connection terminal 354 forms a source contact S of the transistor 300. The connection terminal 354 is formed over a portion of the layer 352 being not covered with the layer 353. A connection terminal 355 forms the drain contact D of the transistor 300. The connection terminal 355 is formed over a portion of the layer 352 being not covered with the layer 353. A connection terminal 356 forms the gate contact pad G of the transistor 300. The connection terminal 356 is formed between the layer 352 and the layer 353 and is disposed between the connection pads 354 and 355. In addition, a portion of the connection pad 354 covers the portion of the layer 353 covering the connection pad 356 as illustrated in view (B) of FIG. 3.

Operation of the transistor 300 is as follows. When the gate G of the transistor 300 is let floating or a negative voltage is applied between its gate G and its source S, the transistor 300 is not conductive or OFF, hence its designation as normally-OFF transistor. To "open" the transistor 300, i.e., turn conductive the same, a positive voltage has to be applied between its gate G and its source S.

FIG. 4 schematically and partly in block form illustrates a part of a switched-mode power supply including an embodiment of an electronic device formed in and on a structure including gallium nitride.

A switched-mode power supply 400 illustrated in FIG. 4 includes a first input node IN400 and a second input node GNDin400. The switched-mode power supply 400 receives between the two input nodes IN400 and GNDin400 an input voltage Vin400. The input node GNDin400 further receives a first reference voltage, for example, a first ground.

The switched-mode power supply 400 further includes, between the input nodes IN400 and GNDin40, a capacitor Cin400. According to an example, the capacitor Cin400 is a filtering capacitor.

The switched-mode power supply 400 further includes a first output node OUT401 and a second output node OUT402. The switched-mode power supply 400 delivers, between these two output nodes OUT401 and OUT402, an output voltage Vout400. According to an example, the output node OUT402 further delivers a second reference voltage, for example a second ground, different from the first reference voltage.

The switched-mode power supply 400 comprises, between the output nodes OUT401 and OUT402, a capacitor Cout400. According to an example, the capacitor Cout400 is a filtering capacitor.

The switched-mode power supply further includes a transformer 401 including two coils 402-IN and 402-OUT. The coil 402-IN is the input coil of the transformer, in other words a first terminal of the coil 402-IN is coupled with, preferably connected to, a first input node IN400, and a second terminal of the coil 402-IN is coupled with, preferably connected to, a terminal 403-DRAIN hereinafter described in more detail. The coil 402-OUT is the output coil of the transformer, in other words a first terminal of the coil 402-OUT is coupled with the first output node OUT401, and a second terminal of the coil 402-OUT is coupled with, preferably connected to, the second output node OUT402. In FIG. 4, the phase points of the coils 402-IN and 402-OUT are shown with black points.

More particularly, the first terminal of the coil 402-OUT is coupled with the output node OUT401 via a diode D401. According to an example, the anode of the diode D401 is coupled with, preferably connected to, the first terminal of the coil 402-OUT, and the cathode of the diode D401 is coupled with, preferably connected to, the output node OUT401. According to an example, the diode D401 is a rectifier diode.

The switched-mode power supply further includes a power switch 403 according to an embodiment. The power switch comprises at least three terminals 403-DRAIN, 403-GND, and 403-IFB. As previously stated, the terminal 403-DRAIN is coupled with, preferably connected to, the second terminal of the coil 402-IN. The terminal 403-GND receives the first reference voltage, i.e., the same reference terminal as the input node GNDin400. The terminal 403-IFB receives a return current IFB400 constituting an image of the output voltage Vout400.

According to an embodiment, the power switch 403 is formed, at least partly, in and on a structure of the type of the structure 100 described in relation with FIG. 1. The power switch 403 comprises a switch 404, or transistor 404, and a control circuit 405 (CMD) of said switch.

Transistor 404 is a HEMT power transistor with enhancement mode, or e-mode transistor, or normally-OFF transistor. In the following disclosure, the switch 404 is called transistor 404. The transistor 404 comprises:

a drain terminal coupled with, preferably connected to, the terminal 403-DRAIN;

a source terminal coupled with, preferably connected to, the terminal 403-GND; and a gate terminal receiving a control voltage 405-CMD supplied by the control circuit 405.

According to an embodiment, the power transistor 404 is sized to withstand a maximum voltage in the order of 650 V between its drain terminal and its source terminal.

According to an embodiment, the switched-mode power supply 400 operates in pulse width modulation. This modulation is performed by the control circuit 405 of the power switch 403.

Control circuit 405 receives as a control current the current IFB400. In other words, the control circuit 405 is further coupled with, preferably connected to, the terminal 403-IBF. The control circuit 405 is further coupled with, preferably connected to, the terminals 403-DRAIN and 403-GND. The control circuit 405 and its operation are described in more detail in relation with FIGS. 5 to 26.

The switched-mode power supply further comprises a feedback circuit 406 (Feedback) receiving, in input, the output voltage Vout400, and outputting the return current IFB400.

Switched-mode power supply described in relation with FIG. 4 is a switched-mode power supply of "OFF-line" type intended to receive in input, i.e., between the nodes IN400 and GNDin400, an input voltage directly from the home electronic network. This input voltage can according to an example, be rectified and/or filtered, but its magnitude is not lowered. Thus, the input voltage Vin400 may have a very high magnitude, i.e., for example, lower than 450 V.

A more detailed embodiment of a switched-mode power supply of the type of the switched-mode power supply 400 is described in more detail in relation with FIG. 27.

FIG. 5 schematically and partly in block form illustrates a power switch 500 of the type of the power switch 403 described in relation with FIG. 4.

According to an embodiment, the power switch 500 is a monolithic component partly formed, preferably wholly formed, in and on a structure of the type of the structure 100 described in relation with FIG. 1.

According to a preferred embodiment, the power switch 500 is formed entirely on a monolithic structure of the type of structure 100 of FIG. 1. Having a power transistor and its control circuit on the same structure, i.e. on the same substrate or the same chip, renders possible to avoid the use of conduction means, such as wires, which otherwise produce parasitic phenomena due to, for example, the length of the wires.

As previously described, the power switch 500 includes the e-mode type transistor 404, the control circuit 405, and the terminals 403-DRAIN, 403-GND, and 403-IFB. The current at the drain of the transistor 404 is referenced IDRAIN404. The voltage between the gterminal 403-IFB, and the terminal 403-GND is referenced Vsense500.

Control circuit 405 is more particularly a pulse width modulation circuit allowing the opening and closure of the transistor 404 to be controlled. More particularly, the control circuit 405 allows a periodic or aperiodic control voltage to be supplied to the gate of the transistor 404.

Control circuit 405 includes an e-mode type transistor 501 and a resistor R501. The transistor 501 and the resistor R501 are series connected, and couple the terminal 403-DRAIN with the terminal 403-IFB. More precisely, the transistor 501 includes a drain terminal coupled with, preferably connected to, the terminal 403-DRAIN, and a source terminal coupled with, preferably connected to a first terminal of the resistor R501. A second terminal of the resistor R501 is coupled with, preferably connected to, the terminal 403-IFB. The gate terminal of the transistor 501 is coupled with, preferably connected to an output terminal of a logic circuit 503 (LOGIC) hereinafter described.

Control circuit 405 further includes a driving circuit 502 (DRIVER), a close control circuit 502, suitable to supply a control potential to the gate of the transistor 404. The driving circuit 502 receives at least one control potential from the logic circuit 503 hereinafter described. Those skilled in the art will be able to implement the driving circuit 502. As an example, example embodiments of such a driving circuit 502 are given in the French patent application numbered FR2210660.

Control circuit 405 further includes the logic circuit 503 (LOGIC) suitable to control the driving circuit 502 and the transistor 501. The logic circuit 503 can be constituted of the logic gates that will be further detailed in relation with FIG. 6, that allow, via the driving circuit 502, the power transistor 404 to be controlled. To this end, the logic circuit 503 receives at least different comparison voltages VCompI-MAX505, VcompOV506, and VcompOP508, and a clock voltage CK500.

Control circuit 405 further includes an oscillating circuit 504 (OSC) suitable to deliver the clock voltage CK500. A detailed example of the oscillating circuit 504 will be detailed in relation with FIGS. 7 and 8.

Control circuit 405 further includes a comparator circuit (C Comp) 505 including an input (+) coupled with the terminal 403-IFB, and an inverting input (−) receiving a threshold voltage VthMAX505. The comparator circuit 505 outputs the comparison voltage VCompIMAX505. The comparator circuit 505 allows checking whether the output current of the comparator circuit 505 does not exceed a maximum value. An example embodiment of a comparator circuit will be described in relation with FIG. 9. Example embodiments of the comparator circuit 505 will be described in relation with FIGS. 10 and 13, and their operations will be described in relation with FIGS. 12 and 14.

Control circuit 405 further includes a comparator circuit 506 (OV) and a filtering circuit 507 (Filt.). The comparator circuit 506 includes an input (+) coupled with the terminal 403-IFB, and an inverting input (−) receiving a threshold voltage VthOV506. The output of the comparator circuit 506 is coupled with, preferably connected to, an input of the filtering circuit 507. The filtering circuit outputs the comparison voltage VcompOV506. The comparator circuit 506 and the filtering circuit 507 allow checking whether the output of the power switch 500 has no shorting. The operation of these circuits will be described in relation with FIGS. 21 to 24.

Control circuit 405 further includes a comparator circuit 508 (OP) and a filtering circuit 509 (Filt.). The comparator circuit 508 includes an input (+) coupled with the terminal 403-IFB, and an inverting input (−) receiving a threshold voltage VthOP508. The output of the comparator circuit 508 is coupled with, preferably connected to, an input of the filtering circuit 509. The filtering circuit outputs the comparison voltage VcompOP508. The comparator circuit 508 and the filtering circuit 509 allow checking whether the output of the power switch 500 is not an open circuit. The operation of these circuits will be described in relation with FIGS. 15 to 20.

Circuits delivering the threshold voltages VthIMX505, VthOV506, and VthOP508 will be described in relation with FIGS. 25 and 26.

Figure 6:
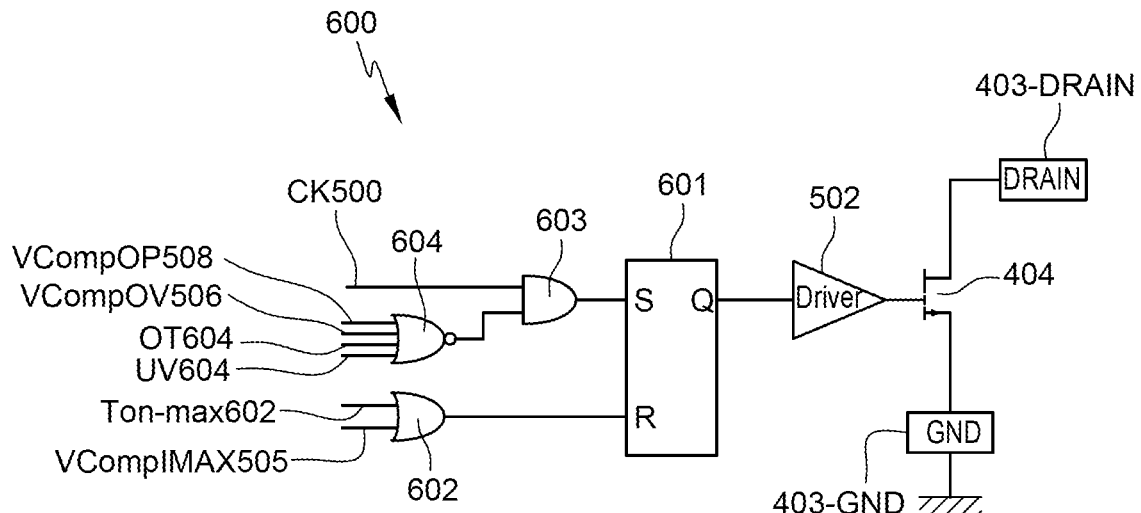
FIG. 6 illustrates an example embodiment of a logic circuit of the embodiment of FIG. 5.

FIG. 6 illustrates an example embodiment of a logic circuit 600 of the type of the logic circuit 503 described in relation with FIG. 5. FIG. 6 further illustrates the driving circuit 502 (DRIVER), the power transistor 404, and the terminals 403-DRAIN (DRAIN) and 403-GND (GND), all previously described.

Logic circuit 600 includes an RS-type flip-flop 601. The flip-flop 601 includes three terminals, including a set terminal S, a reset terminal R, and an output terminal Q. When a rising edge is applied to the set terminal S, the output terminal Q delivers a signal having a high state, and when a rising edge is applied to the reset terminal R, the output terminal Q delivers a signal having a low state. We name high signal a signal the amplitude value of which corresponds to a high binary state, i.e., a binary state equal to "1." Similarly, we name low-state signal a signal the amplitude value of which corresponds to a low binary state, i.e., a binary state equal to "0."

Output terminal Q of the flip-flop 601 is coupled with, preferably connected to, an input of the driving circuit 502 of the power transistor 404.

Logic circuit 600 further includes a logic gate 602 of the OR type with two inputs and one output. The output of the logic gate 602 is coupled with, preferably connected to, the terminal R of the flip-flop 601. A first input of the logic gate 602 receives the output voltage VCompIMAX505 of current comparator circuit 505 described in relation with FIG. 5. A second input of the logic gate 602 receives a monitoring voltage Ton-max602 allowing checking that a conduction cycle time of power transistor 404 does not exceed a time limit. According to an example, the voltage Ton-max602 is delivered by the oscillating circuit 504 described in relation with FIG. 5.

Logic circuit 600 further includes a logic gate 603 of the AND type with two inputs and one output. The output of the logic gate 603 is coupled with, preferably connected to, the set terminal of the flip-flop 601. A first terminal of the logic gate 603 receives the clock voltage CK500 supplied by the oscillating circuit 504 described in relation with FIG. 5.

Logic circuit 600 further includes a logic gate 604 of the NOR type with at least two inputs and one output. The output of the logic gate 604 is coupled with, preferably connected to, the second input of the logic gate 603. A first input of the logic gate 604 receives the voltage VComp-pOP508 supplied by the filtering circuit 509 described in relation with FIG. 5. A second input of the logic gate 604 receives the voltage VcompOV506 supplied by the filtering circuit 507 described in relation with FIG. 5.

IN addition, optionally, the logic gate 604 can include additional inputs receiving other voltages, such as a voltage OT604 for detecting an overheating, and/or a voltage UV604 for detecting that a supply voltage of the control circuit 403 of the power transistor 404 is too low.

Thus, the values of the voltages CK500, VcompOP508, VcompOV506, VCompIMAX505, and Ton-max602, and optionally the values of the voltages OT604 and UV604 have the ability to start and/or stop a conduction cycle of the power transistor 404.

Figure 7:
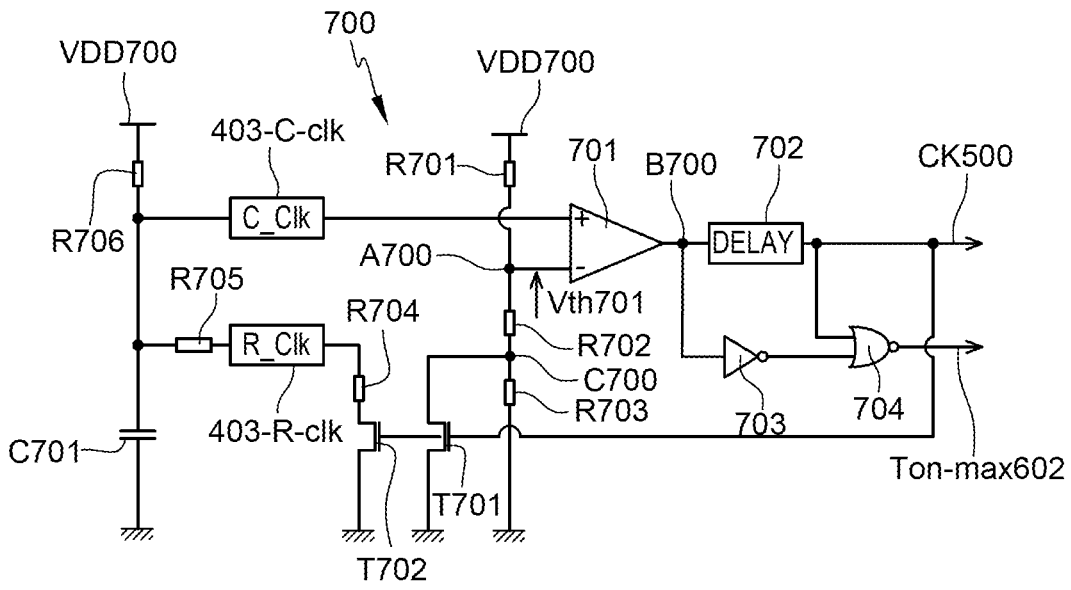
FIG. 7 illustrates an embodiment of an oscillating circuit of the embodiment of FIG. 5.

FIG. 7 illustrates an embodiment of an oscillating circuit 700 of the type of the oscillating circuit 504 described in relation with FIG. 5.

Oscillating circuit 700 includes a comparator circuit 701 with two inputs and one output. A first input (+) of the comparator circuit 701 is coupled with, preferably connected to, a terminal 403_c_clk constituting a terminal of the power switch 403 described in relation with FIG. 4. A second input (−) of the comparator circuit 701 is an inverting input, and is coupled with, preferably connected to, a node A700 for applying a threshold voltage Vth701 of the comparator circuit. The output of the comparator circuit 701 is coupled with, preferably connected to, a node B700. An example embodiment of the comparator circuit 701 is described in relation with FIG. 9.

Oscillating circuit 700 further includes a delay element 702 (DELAY). The delay element 702 includes an input coupled with, preferably connected to, the node B700 and an output delivering the clock voltage CK500.

Oscillating circuit 700 further includes a logic gate 703 of the inverting-type and a logic gate 704 of the NOR-type. An input of the logic gate 703 is coupled with, preferably connected to, the node B700. An output of the logic gate 703 is coupled with, preferably connected to, a first input of the logic gate 704. A second input of the logic gate 704 is coupled with, preferably connected to, the output of delay element 702. An output of the logic gate 704 delivers the voltage Ton-max602 described in relation with FIG. 6.

Oscillating circuit 700 further includes a voltage divider bridge allowing generating the threshold voltage Vth701. The voltage divider bridge includes three resistors R701, R702, and R703. A first terminal of the resistor R701 is coupled with, preferably connected to, a node receiving a supply voltage VDD700, and a second terminal of the resistor R701 is coupled with, preferably connected to, the inverting input of the comparator circuit 701. A first terminal of the resistor R702 is coupled with, preferably connected to, the inverting input of the comparator circuit 701, and a second terminal of the resistor R702 is coupled with, preferably connected to, a node C700. A first terminal of the resistor R703 is coupled with, preferably connected to, the node C700, and a second terminal of the resistor R703 is coupled with, preferably connected to, the terminal 403-700. In FIG. 7, terminal 403-700 is represented by the ground symbol.

Oscillating circuit 700 further includes a transistor T701 of e-mode type with a first conduction terminal coupled with, preferably connected to, the node C700, and a second conduction terminal coupled with, preferably connected to, the terminal 403-GND. The gate of the transistor T701 is preferably coupled with the output of the delay element 702.

Oscillating circuit 700 further includes a transistor T702 of e-mode type and a resistor R704. A first conduction terminal of the transistor T702 is coupled with, preferably connected to, a first terminal of the resistor R704, and a second conduction terminal of the transistor T702 is coupled with, preferably connected to, the terminal 403-GND. A second conduction terminal of the resistor R704 is coupled with, preferably connected to, a terminal 403_R_clk consti-
tuting another terminal of the power switch 403 described in
relation with FIG. 4.

Oscillating circuit 700 further includes two resistors R705
and R706 and a capacitor C701. A first terminal of the
resistor R705 is coupled with, preferably connected to, the
terminal 403_R_clk, and a second terminal of the resistor
R705 is coupled with, preferably connected to, the terminal
403_c_clk. A first terminal of the resistor R706 is coupled
with, preferably connected to, the terminal 403_R_clk, and
a second terminal of the resistor R705 is coupled with,
preferably connected to, the node receiving the supply
voltage VDD700. A first terminal of the capacitor C701 is
coupled with, preferably connected to, the terminal
403_c_clk, and a second terminal of the capacitor C701 is
coupled with, preferably connected to, the terminal 403-
GND.

Figure 8:
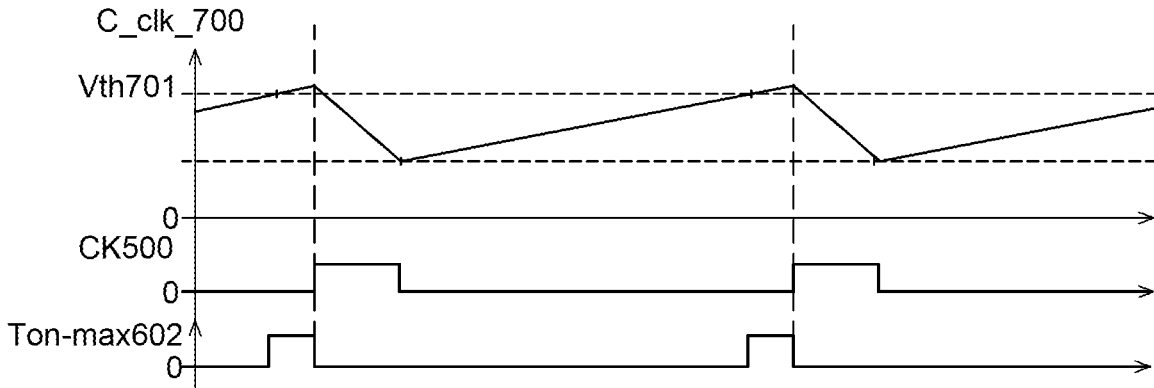
FIG. 8 illustrates time diagrams representing the operation of the oscillating circuit of FIG. 7.

Operation of the oscillating circuit 700 is described in
relation with FIG. 8.

FIG. 8 illustrates time diagrams representing the opera-
tion of the oscillating circuit 700 described in relation with
FIG. 7.

More particularly, FIG. 8 includes the following time
diagrams:

a time diagram illustrating the time evolution of voltage
C_clk_700 equal to the potential difference between the
terminal 403-c_clk and the terminal 403-GND;

a time diagram illustrating the time evolution of the clock
voltage CK500; and a time diagram illustrating the time evolution of the
voltage Ton-max602.

Circuit of the RC series type formed by the capacitor
C701 and the resistor R706 is supplied with the supply
voltage VDD700. The voltage C_clk_700 is a periodic
voltage that is continuously compared by comparator circuit
701, with the threshold voltage Vth701.

Clock voltage CK500 is a periodic voltage with regularly
spaced positive pulses. The period of the clock voltage
CK500 is set by the charging time of the capacitor C701.
The duration of the positive pulses of the clock voltage
CK500 is set by the duration of the discharge of the capacitor
C701 in resistors R706 and R705.

Voltage Ton-max602 is a periodic voltage having regu-
larly spaced positive pulses. The period of the voltage
Ton-max602 is equal to the period of the clock voltage
CK500. A period of the voltage Ton-max602 starts, in a low
state, at the time when the CK500 clock voltage has a rising
edge, i.e., from the time when starts a positive pulse of the
clock voltage. The voltage Ton-max602 is in a high state
after a duration set by the delay element 702. The period of
the voltage Ton-max602 ends with a falling edge at the time
when the clock voltage CK500 presents a new rising edge.

Figure 9:
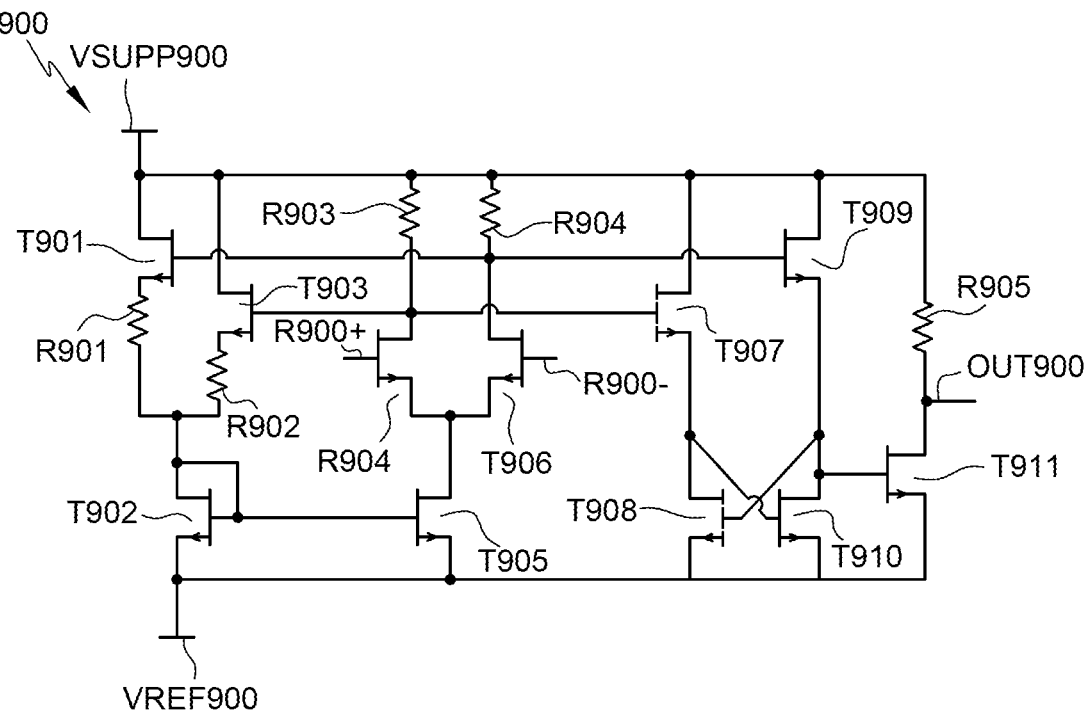
FIG. 9 illustrates an example embodiment of a comparator circuit.

FIG. 9 illustrates an example embodiment of a compara-
tor circuit 900 usable in the embodiment of the switched-
mode power supply 400 described in relation with FIG. 4.

Comparator circuit 900 includes two supply nodes
VSUPP900 and VREF900, two input nodes N900+ and
N900− and an output node OUT900. The supply node
VSUPP900 receives a voltage higher than the voltage
received by the node VREF900, for example, the supply
node VSUPP receives a voltage of the order of 6 V and the
node VREF900 receives a voltage of the order of 0 V. The
input nodes N900+ and N900− receive the voltages to be
compared. The node OUT900 delivers the voltage repre-
senting the result of comparing the voltages received by the
nodes N900+ and N900−.

Comparator circuit 900 includes, between the nodes
VSUPP900 and VREF900, and on a first branch, a transistor
T901 of d-mode type, a resistor R901, and a transistor T902
of d-mode type. The drain of the transistor T901 is coupled
with, preferably connected to, the node VSUPP900, and the
source of the transistor T901 is coupled with, preferably
connected to, a first terminal of the resistor R901. The
second terminal of the resistor R901 is coupled with, pref-
erably connected to, the drain and gate of the transistor
T902. The source of the transistor T902 is coupled with,
preferably connected to, the node VREF900.

Comparator circuit 900 further includes, between node
VSUPP900 and the middle node between the resistor R901
and the transistor T902, and on a second branch, a transistor
T903 of d-mode type and a resistor R902. The drain of the
transistor T903 is coupled with, preferably connected to, the
node VSUPP900, and the source of the transistor T903 is
coupled with, preferably connected to, a first terminal of the
resistor R902. The second terminal of the resistor R902 is
coupled with, preferably connected to, the middle node
between the resistor R901 and the transistor T902. In one
embodiment, the transistors T901 and T902 can be transis-
tors of e-mode type.

Comparator circuit 900 includes, between nodes
VSUPP900 and VREF900, and on a third branch, a resistor
R903, a transistor T904 of d-mode type, and a transistor
T905 of d-mode type. A first terminal of the resistor R903 is
coupled with, preferably connected to, the node VSUPP900,
and a second terminal of the resistor R903 is coupled with,
preferably connected to, the drain of the transistor T904 and
the gate of the transistor T903. The source of the transistor
T904 is coupled with, preferably connected to, the drain of
the transistor T905. The source of the transistor T905 is
coupled with, preferably connected to, the node VREF900.
The gate of the transistor T904 is coupled with, preferably
connected to, the node N900+.

Comparator circuit 900 includes, between nodes
VSUPP900 and VREF900, and on a fourth branch, a resistor
R904, a transistor T906 of d-mode type, and the transistor
T905. A first terminal of the resistor R904 is coupled with,
preferably connected to, the node VSUPP900, and a second
terminal of the resistor R904 is coupled with, preferably
connected to, the drain of the transistor T906 and the gate of
the transistor T901. The source of the transistor T906 is
coupled with, preferably connected to, the drain of the
transistor T905. The gate of the transistor T906 is coupled
with, preferably connected to, the node N900−.

Comparator circuit 900 includes, between nodes
VSUPP900 and VREF900, and on a fifth branch, a transistor
T907 of e-mode type, and a transistor T908 of e-mode type.
The drain of the transistor T907 is coupled with, preferably
connected to, the node VSUPP900, and the source of the
transistor T907 is coupled with, preferably connected to, the
drain of the transistor T908. The source of the transistor
T908 is coupled with, preferably connected to, node
VREF900. The gate of the transistor T907 is coupled with,
preferably connected to, the gate of the transistor T903.

Comparator circuit 900 includes, between nodes
VSUPP900 and VREF900, and on a sixth branch, a tran-
sistor T909 of d-mode type, and a transistor T910 d-mode
type. The drain of the transistor T909 is coupled with,
preferably connected to, the node VSUPP900, and the
source of the transistor T909 is coupled with, preferably
connected to, the drain of the transistor T910. The source of
the transistor T910 is coupled with, preferably connected to, the node VREF900. The gate of the transistor T909 is coupled with, preferably connected to, the gate of the transistor T901.

According to a first example, represented in FIG. 9, the gate of the transistor T908 is coupled with, preferably connected to, the drain of the transistor T910, and the gate of the transistor T910 is coupled with, preferably connected to, the drain of the transistor T908.

In a second example, not represented in FIG. 9, the gates of the transistors T908 and T910 are coupled with, preferably connected to, each other and the drain of the transistor T908.

Comparator circuit 900 includes, between nodes VSUPP900 and VREF900, and on a seventh, and last, branch, a resistor R905 and a transistor T911 of d-mode type. A first terminal of the resistor R905 is coupled with, preferably connected to, the node VSUPP900, and a second terminal of the resistor R905 is coupled with, preferably connected to, the output node OUT900. The drain of the transistor T911 is coupled with, preferably connected to, the node OUT900, and the source of the transistor T911 is coupled with, preferably connected to, the node VREF900. The gate of the transistor T911 is coupled with, preferably connected to, the drain of the transistor T910.

Transistors T904 and T905 are differential input transistors. Resistors R901 and R902 are bias resistors. Transistors T901, T902, T903, and T905 are bias transistors. Transistors T907 and T909 are voltage-follower transistors. Transistors T908 and T910 are current comparators. The seventh branch is an output branch.

Comparator circuit 900 operates as follows. When the gate voltage of the transistor T906 becomes higher than the gate voltage of the transistor T904, then the gate voltage of the transistor T909 becomes lower than the gate voltage of the transistor T907, that causes the gate voltage of the transistor T911 becoming lower than the threshold voltage of the transistor T911. The output voltage VOUT900 is then coupled with the voltage VSUPP900.

Figure 10:
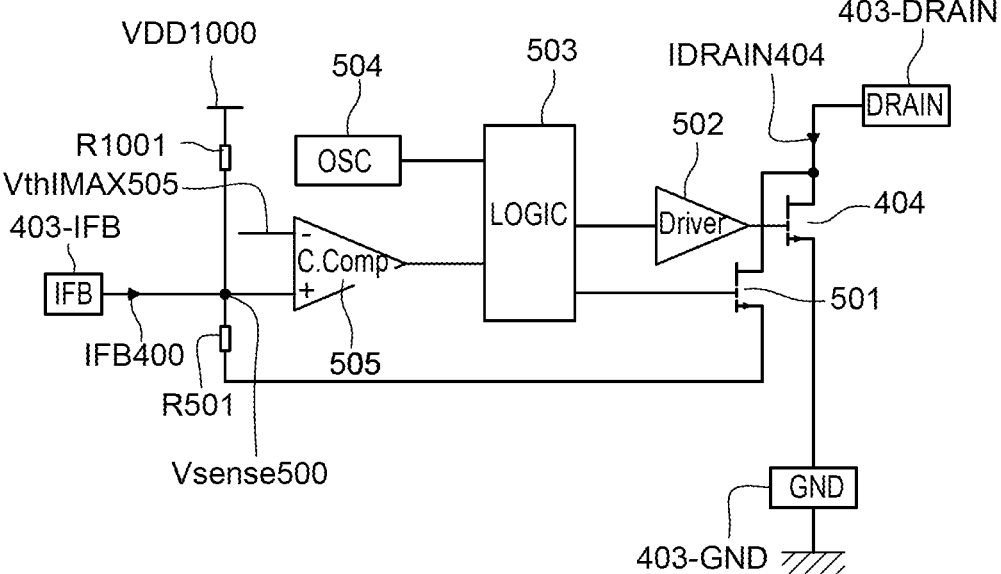
FIG. 10 illustrates an embodiment of a current comparator circuit of the embodiment of FIG. 5.

FIG. 10 illustrates a first embodiment of a current comparator circuit 1000 of the embodiment of FIG. 5.

As explained in relation with FIG. 5, the control circuit 405 of the power transistor 404 includes the comparator circuit 505. The current comparator circuit 1000 allows checking whether the output current delivered by the switched-mode power supply 400 including the power switch 403 does not exceed a threshold value. The feedback current IFB400 described in relation with FIG. 4 is an image of the output current of the switched-mode power supply, and allows this comparison to be performed.

No load results in an output voltage exceeding a limit value, also known as output voltage overload. Such an increase in the output voltage results in an increase in the feedback current IFB400.

Comparator circuit 505 (C Comp) includes an input (+) coupled to the terminal 403-IFB, and an inverting input (−) receiving a threshold voltage VthIMAX505. The comparator circuit 505 outputs the comparison voltage VCompI-MAX505 to the logic circuit 503.

Terminal 403-IFB is further coupled with a node receiving a supply voltage VDD1000 via a resistor R1001.

Figure 11:
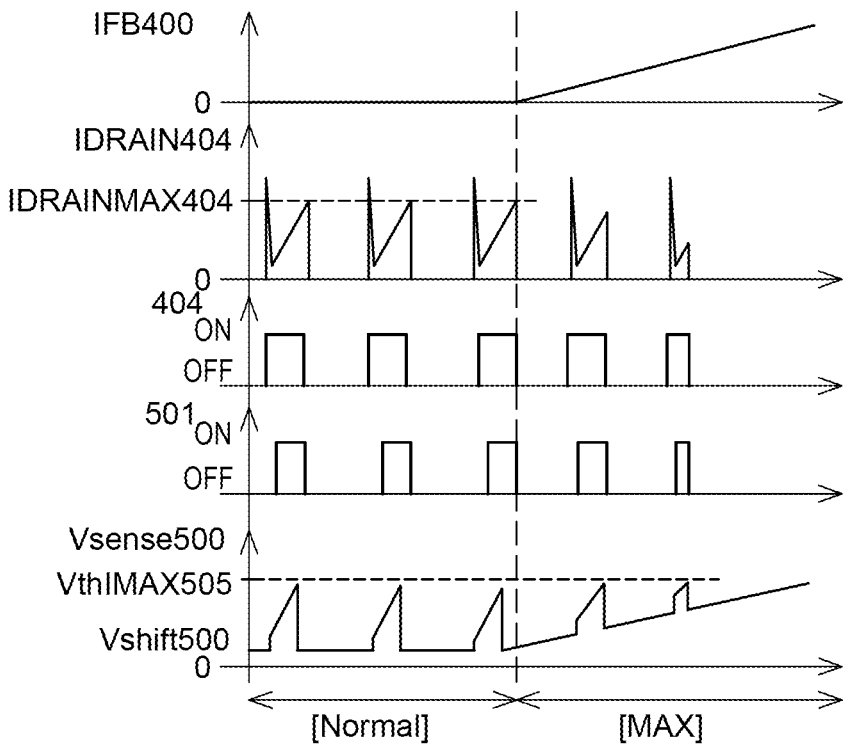
FIG. 11 illustrates time diagrams representing the operation of the current comparator circuit of FIG. 10.
Figure 12:
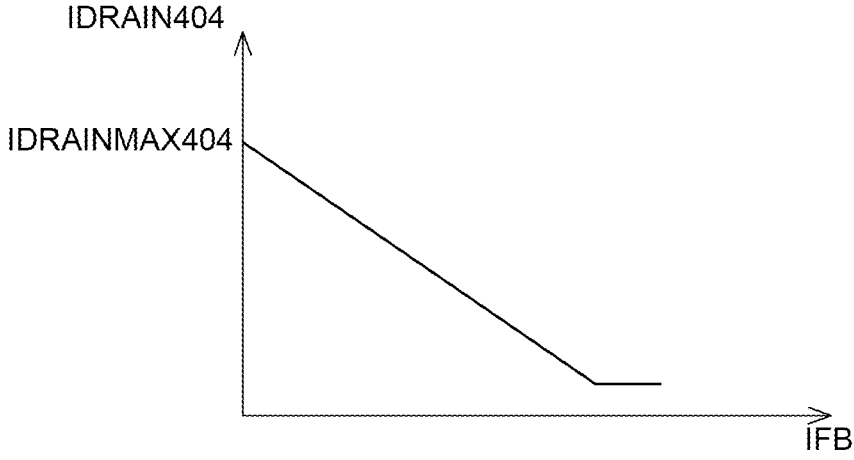
FIG. 12 illustrates a curve representing the operation of the current comparator circuit of FIG. 10.

Operation of this current comparison is described in more detail in relation with FIGS. 11 and 12.

FIG. 11 illustrates time diagrams representing the operation of the comparison performed by the comparator circuit 505 of FIG. 10.

More particularly, FIG. 11 includes the following time diagrams:

a time diagram illustrating the time evolution of the current IFB400;

a time diagram illustrating the evolution of the current IDRAIN404;

a time diagram illustrating the open (OFF) or closed (ON) state of the transistor 404;

a time diagram illustrating the open (OFF) or closed (ON) state of the transistor 501; and a time diagram illustrating the time evolution of a voltage Vsense500 representing the voltage between the non-inverting input terminal (+) of the comparator circuit 505 and the terminal 403-GND.

As previously mentioned, the power transistor 404 is driven by the driving circuit 502, which in turn receives a control voltage from the logic circuit 503. During its operation, the power transistor 404 alternates between open and closed states, the frequency of which is defined by the frequency of the clock voltage CK500. More specifically, on each rising edge of the clock voltage CK500, the power transistor 404 presents a closed state, or on-state, the minimum duration of which is defined by the duration of a high state of the clock voltage CK500. The current IDRAIN404 at the drain of the transistor 404 has a positive peak when the transistor opens, and then linearly increases as illustrated.

Transistor 501 is controlled by the falling edges of the clock voltage CK500.

During an opening phase, or conduction phase, of the power transistor 404, the feedback current IFB is compared with a threshold current IFBMAX. To carry out this comparison, the voltage Vsens500 is compared with the voltage VthIMAX505. The voltage VthIMAX505 is obtained thanks to a circuit hereinafter described in relation with FIGS. 25 and 26. In addition, to optimize the comparison, voltage Vsense500 has a component Vshift505 dependent on resistors R501 and R1001 and on the voltage VDD1000, which represents the internal offset voltage of the comparator circuit 505.

FIG. 11 illustrates two cases, a case [Normal] during which the feedback current IFB400 remains constant at a low value, e.g., zero, and a case [Max] during which feedback current IFB400 has an increase.

When the feedback current IFB400 increases, the voltage Vsense500 also increases, and also during an open or non-conductive state of the transistor 404. This increase is detected by the comparator circuit 505, and then taken into account by the logic circuit 503, which receives the voltage VthIMAX505, and shortens the following conduction phase or phases of the transistor 404.

FIG. 12 illustrates a curve illustrating the evolution of the drain current IDRAIN404 as a function of the feedback current IFB400 during the start of a conduction phase.

Drain current IDRAIN404 is given by the following mathematical formula:

$$IDRAIN404 = -IFB400 * \frac{R501 + Rdson404}{Rdson404} - \qquad \text{[Math 1]}$$
$$VDD1000 * \frac{R501 + Rdson404}{Rdson404 * R1001} +$$
$$VthIMAX505 * \frac{R501 + R1001 + Rdson404}{Rdson404 * R1001}$$

wherein Rdson404 represents the internal resistance of the power transistor 404 when conducting.

Figure 13:
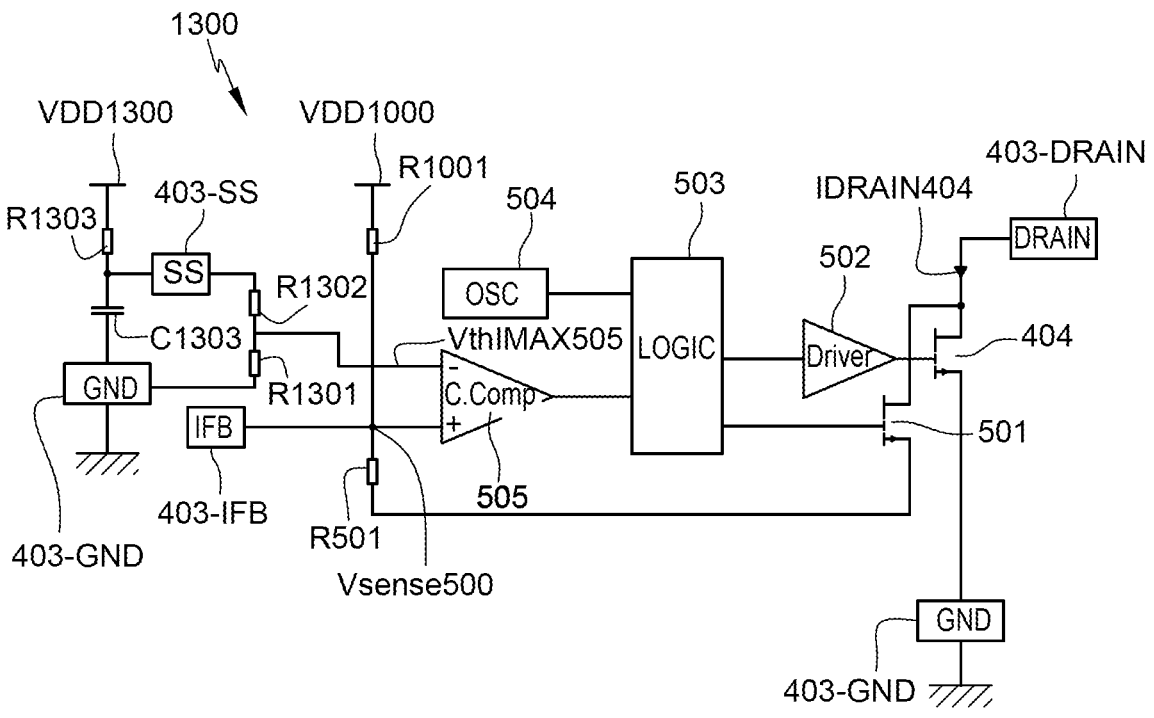
FIG. 13 illustrates an embodiment of a current comparator circuit of the embodiment of FIG. 5.

FIG. 13 illustrates a second embodiment of a current comparator circuit 1300 of the embodiment of FIG. 5, of the type of the current comparator circuit 1000 described in relation with FIG. 10.

Circuit 1300 has elements in common with the circuit 1000. These common elements are not described in detail again here, only the differences between circuits 1000 and 1300 are highlighted.

Like circuit 1000, the circuit 1300 includes the comparator circuit 505 and the resistors R501 and R1001. The circuit 1300 further includes a component arrangement allowing the voltage value VthIMAX505 to be set, and allowing a soft start to be performed.

Circuit 1300 thus further includes two resistors R1301 and R1302. A first terminal of the resistor R1301 is coupled with, preferably connected to, the terminal 403-GND, and a second terminal of the resistor R1301 is coupled with, preferably connected to, the inverting input terminal of the comparator circuit 505. A first terminal of the resistor R1302 is coupled with, preferably connected to, the inverting input terminal of the comparator circuit 505, and a second terminal of the resistor R1301 is coupled with, preferably connected to, a terminal 403-SS which may form a terminal of the power switch 403. Resistors R1301 and R1302 allow the value of the voltage VthIMAX505 to be set.

Circuit 1300 further includes a resistor R1303 and a capacitor C1301. A first terminal of the resistor R1303 is coupled with, preferably connected to, a node receiving a supply voltage VDD1300, and a second terminal of the resistor R1301 is coupled with, preferably connected to, the terminal 403-SS. According to an example, the supply voltage VDD1300 is the same as the supply voltage VDD1000. A first terminal of the capacitor C1301 is coupled with, preferably connected to, the terminal 403-GND, and a second terminal of the capacitor C1301 is coupled with, preferably connected to, the terminal 403-GND.

Figure 14:
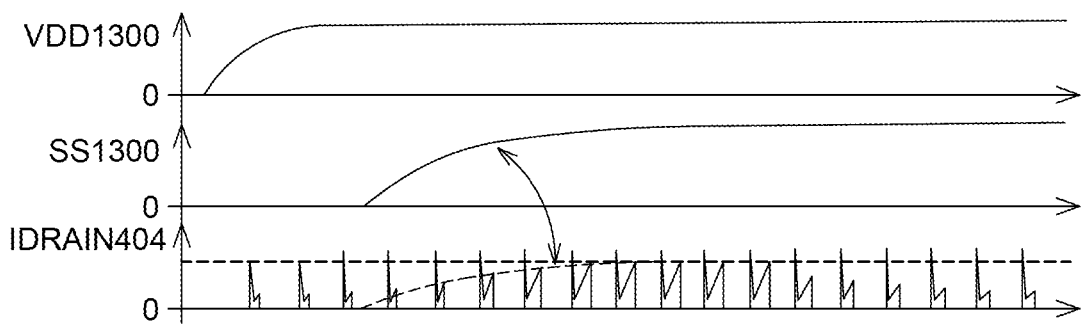
FIG. 14 illustrates time diagrams representing the operation of the current comparator circuit of FIG. 13, and particularly an embodiment having a slow start-up of the triggering threshold of the comparator.

Operation of the circuit 1300 is described in relation with FIG. 14.

FIG. 14 illustrates time diagrams representing the operation of the current comparator circuit 1300 of FIG. 13. More particularly, FIG. 14 illustrates a slow-start mode of operation of the comparator circuit, in which the trigger threshold of the comparator circuit is slowly increased.

More particularly, FIG. 14 illustrates the following time diagrams:

- a time diagram illustrating the time evolution of the supply voltage VDD1300;
- a time diagram illustrating the time evolution of a voltage SS1300 taken between the terminal 403-SS and the terminal 403-GND; and
- a time diagram representing the time evolution of the current IDRAIN404.

Voltage SS1300 is a start-up control voltage of the power switch 403. When the power switch 403 starts up, its power supply circuits delivering the voltage VDD1300 start, and the voltage VDD1300 gradually increases, via the capacitor 1303. When the voltage SS1300 increases in turn, and allows the value of the voltage VthIMAX505 at start-up to be limited, and thus the value of the current IDRAIN404 during start-up to be limited.

Figure 15:
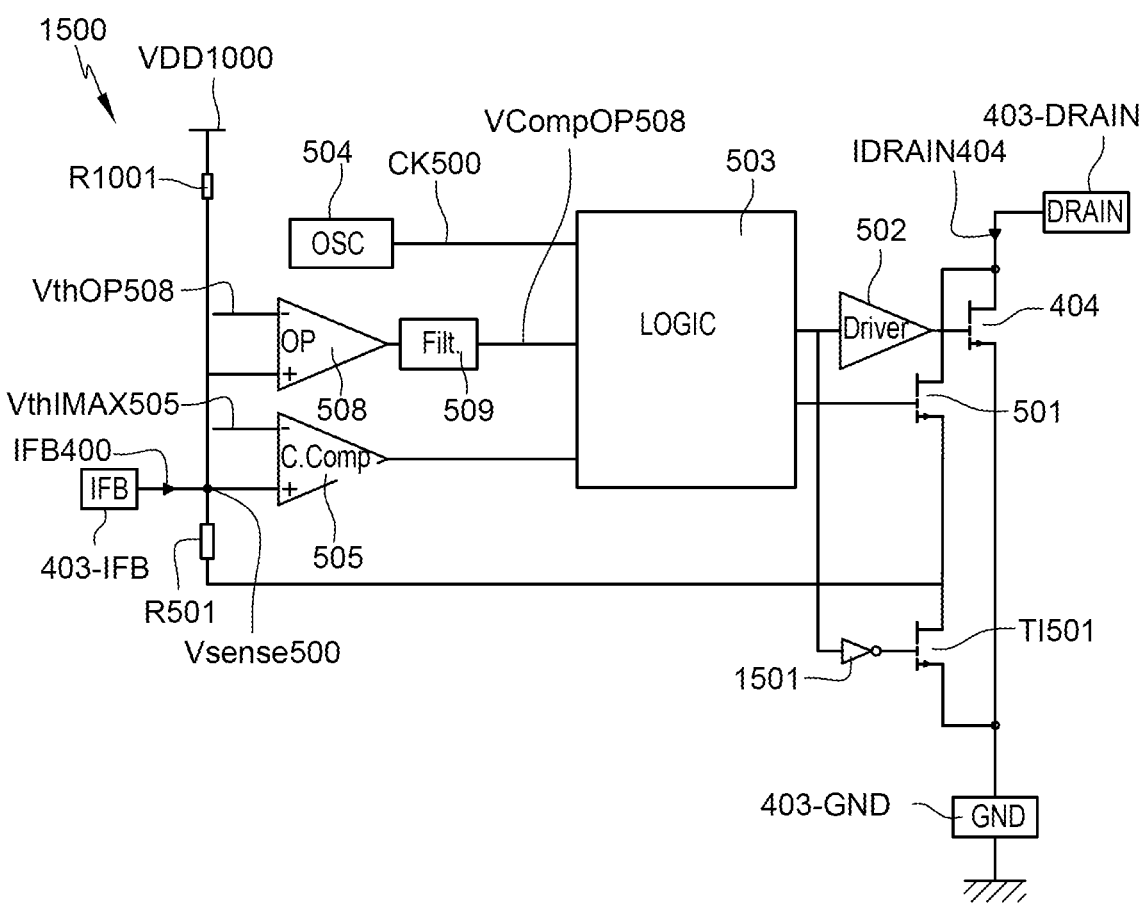
FIG. 15 illustrates an embodiment of a circuit for detecting an open output load of the embodiment of FIG. 5.

FIG. 15 illustrates an example embodiment of a detection circuit 1500 for an open output load of the embodiment of FIG. 5.

As explained in relation with FIG. 5, the control circuit 405 of the power transistor 404 includes the comparator circuit 508 and the filtering circuit 509, both of which allowing an absence of load at the output of the switched-mode power supply including the power switch 403 to be detected. An absence of load results in an output voltage exceeding a limit value. As previously mentioned, the image of the output voltage of the switched-mode power supply is given by the feedback current IFB400. Detection circuit 1500 is thus adapted to detect an increase in the feedback current IFB400.

Detection circuit 1500 includes the comparator circuit 508 and the filtering circuit 509. The comparator circuit 508 is, for example of the type of the comparator circuit 900 described in detail in relation with FIG. 9. The filtering circuit and its operation will be described in detail in relation with FIGS. 17 to 20.

As previously mentioned, the comparator circuit 508 (OP) includes a non-inverting input terminal (+) coupled with the terminal 403-IFB, and an inverting input terminal (−) receiving threshold voltage VthOP508. According to an embodiment, the threshold voltage VthIMAX505 is lower than the threshold voltage VthOP508. The comparator circuit 505 outputs a voltage to the filtering circuit 509, which outputs in turn the comparison voltage VCompOP508 to the logic circuit 503. The comparator circuit 508 allows an excessive current increase to be detected.

Purpose of the filtering circuit 509 is to take into account the result of the comparator circuit 508 only when the power transistor 403 is in an open state, i.e., a non-conductive state.

Detection circuit 1500 further includes an inverter circuit 1501 and a transistor T1501. According to an example, transistor T1501 is a transistor of d-mode type. The inverter circuit 1501 includes an input terminal coupled with, preferably connected to, the input of the driving circuit 502, and an output terminal coupled with, preferably connected to, the gate terminal of the transistor T1501. A first conduction terminal of the transistor T1501 is coupled with, preferably connected to, a node N1501 coupling a terminal of the resistor R501 to a conduction terminal of the transistor 501. A second conduction terminal of the transistor T1501 is coupled with, preferably connected to, the terminal 403-GND.

Figure 16:
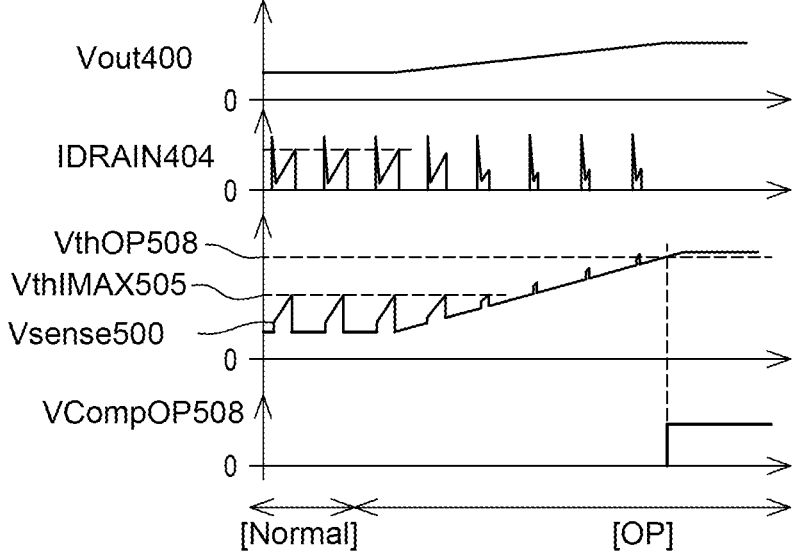
FIG. 16 illustrates time diagrams representing the operation of the circuit for detecting an open output load of FIG. 15.

Operation of this current overload detection is described in relation with FIG. 16.

FIG. 16 illustrates time diagrams representing the operation of the detection circuit of an open output load of FIG. 15.

More particularly, FIG. 16 illustrates the following time diagrams:

- a time diagram illustrating the time evolution of the output voltage Vout400 of the switched-mode power supply including the power switch 403;
- a time diagram illustrating the time evolution of the current IDRAIN404;
- a time diagram illustrating the time evolution of the voltage Vsense500; and
- a time diagram illustrating the time evolution of the voltage VCompOP508.

FIG. 16 illustrates two cases, the case [Normal] during which the switched-mode power supply has an output load, and during which the voltage Vout400 is constant, and a case [OP] during which the output load is removed, and during which the voltage Vout400 increases.

As the voltage Vout400 increases, the feedback current IFB400 also increases, and its image, the voltage Vsense500, increases accordingly. The voltage Vsense500 initially exceeds threshold voltage VthIMAX505, and the duration of the conduction cycles of the power transistor 404 is gradually reduced. When the voltage Vsense500 exceeds the threshold voltage VthOP508, and the power transistor is in an open state, the voltage VcompOP508 goes to a high level indicating that the output load is missing.

Figure 17:
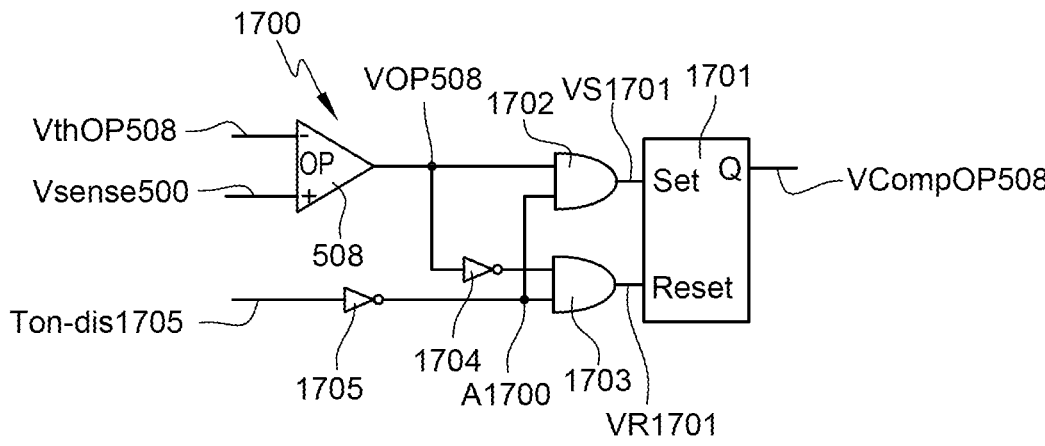
FIG. 17 illustrates an embodiment of a filtering circuit of the embodiment of FIG. 15.

FIG. 17 illustrates an embodiment of a filtering circuit 1700 of the detection circuit 1500 described in relation with FIG. 15. FIG. 17 illustrates the filtering circuit 1700 and the comparator circuit 508 (OP).

Filtering circuit 1700 includes an RS-type flip-flop 1701, i.e., a flip-flop of the same type as the flip-flop 601 of the logic circuit 503. In other words, the flip-flop 1701 includes three terminals, including a set terminal Set, a reset terminal Reset and an output terminal Q. Output terminal Q delivers the comparison voltage VCompOP508.

Filtering circuit 1700 further includes two AND-type logic gates 1702 and 1703, each with two input terminals and one output terminal. A first input terminal of the logic gate 1702 is coupled with, preferably connected to, the output terminal of the comparator circuit 508. The output voltage of the comparator circuit 508 is hereinafter referred to as VOP58. A second input terminal of the logic gate 1702 is coupled with, preferably connected to, a node A1700. The output terminal of the logic gate 1701 is coupled with, preferably connected to, the terminal Set of the flip-flop 1701. A first input terminal of the logic gate 1703 is coupled with, preferably connected to, the node A1700. The output terminal of the logic gate 1702 is coupled with, preferably connected to, the terminal Reset of the flip-flop 1701.

Filtering circuit 1700 further includes an inverter circuit 1704. An input terminal of the inverter circuit 1704 is coupled with, preferably connected to, the output terminal of the comparator circuit 508. An output terminal of the inverter circuit 1704 is coupled with, preferably connected to, a second input terminal of the logic gate 1703.

Filtering circuit 1700 further includes an inverter circuit 1705. An input terminal of the inverter circuit 1705 is coupled with, preferably connected to, a node delivering a control voltage Ton_dis1705. A circuit for generating the control voltage Ton_dis1705 is described in detail in relation with FIG. 19. An output terminal of the inverter circuit 1705 is coupled with, preferably connected to, the node A1700.

Figure 18:
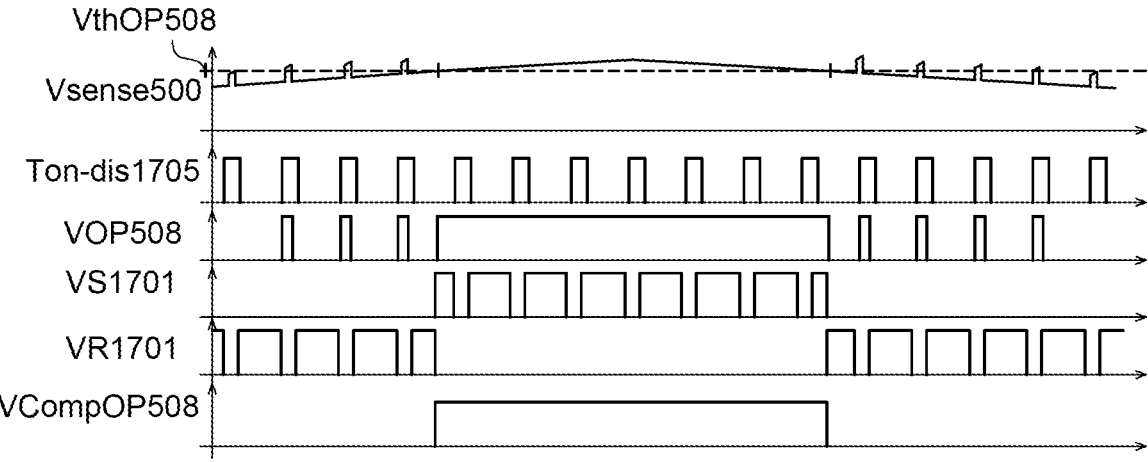
FIG. 18 illustrates time diagrams representing the operation of the filtering circuit of FIG. 17.

Operation of the filtering circuit is described in relation with FIG. 18.

FIG. 18 illustrates time diagrams representing the operation of the filtering circuit 1700 of FIG. 17.

More particularly, FIG. 18 illustrates the following time diagrams:

a time diagram illustrating the time evolution of the voltage Vsense500;

a time diagram illustrating the time evolution of the control voltage Ton_dis1705;

a time diagram illustrating the time evolution of the voltage VOP508;

a time diagram illustrating the time evolution of a voltage VS1701 taken at the input terminal Set of the flip-flop 1701;

a time diagram illustrating the time evolution of a voltage VR1701 taken at the input terminal Reset of the flip-flop 1701;

a time diagram illustrating the time evolution of the voltage VCompOP508.

When the voltage Vsense500 exceeds the threshold voltage VthOP508, the voltage VOP508 goes to a high state. The control voltage Ton_dis1705 is in a high state whenever the driver circuit requests the power transistor 404 to switch to the closed state, i.e., the conductive state. The voltages VOP508 and Ton_dis1705 are combined so that the comparison voltage VCompOP508 takes into account the high states of the voltage VOP508 only when the power transistor is in the open state.

Figure 19:
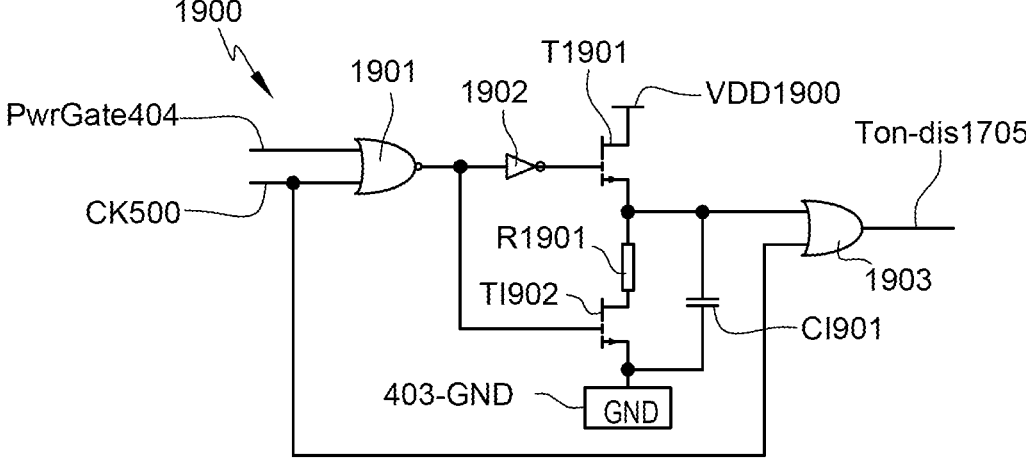
FIG. 19 illustrates an embodiment of a generation circuit of a control signal of the filtering circuit of FIG. 17.

FIG. 19 illustrates an embodiment of a circuit 1900 for generating the control signal Ton_dis1705 of the filtering circuit 1700 of FIG. 17.

Circuit 1900 includes a NOR-type logic gate 1901 with two input terminals and one output terminal. A first input terminal of the logic gate 1901 receives a voltage Pwr-Gate404 corresponding to the control voltage applied to the gate terminal of the power transistor 404. A second input terminal of the logic gate 1901 receives the clock voltage CK500.

Circuit 1900 further includes an inverter circuit with an input terminal coupled with, preferably connected to, the output terminal of the logic gate 1901.

Circuit 1900 further includes a transistor T1901 of e-mode type, a resistor R18901 and a transistor T1902 of e-mode type. A first conduction terminal of the transistor T1901 is coupled with, preferably connected to, a node providing a supply voltage VDD1900. A second conduction terminal of the transistor T1901 is coupled with, preferably connected to, a first terminal of the resistor R1901. The gate terminal of the transistor T1901 is coupled with, preferably connected to, the output terminal of the inverter circuit 1902. A second terminal of the resistor R1901 is coupled with, preferably connected to, a first conduction terminal of the transistor T1902. A second conduction terminal of the transistor T1902 is coupled with, preferably connected to, the terminal 403-GND. The gate terminal of the transistor T1902 is coupled with, preferably connected to, the output terminal of the logic gate 1901.

Circuit 1900 further includes a capacitor C1901 coupling the middle node between the transistor T1901 and the resistor R191 to the terminal 403-GND.

Finally, the circuit 1900 further includes an OR-type logic gate 1903 with two input terminals and one output terminal. A first input terminal of the logic gate 1903 is coupled with, preferably connected to, the middle node between the transistor T1901 and the resistor R191, and the terminal 403-GND. A second input terminal of the logic gate 1903 receives the clock voltage CK500. The output terminal of the logic gate 1903 delivers the control voltage Ton_dis1705.

Figure 20:
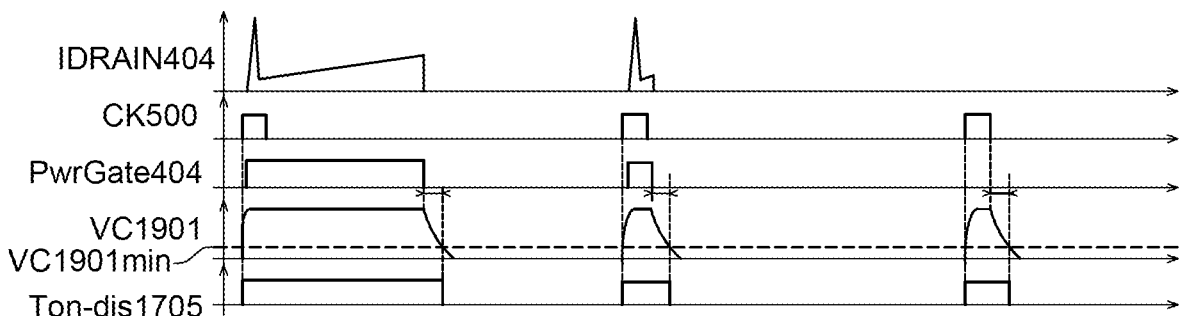
FIG. 20 illustrates time diagrams representing the operation of the generation circuit of FIG. 19.

FIG. 20 illustrates time diagrams illustrating the operation of the circuit 1900 in FIG. 19.

More particularly, FIG. 20 illustrates the following time diagrams:

a time diagram illustrating the time evolution of the current IDRAIN404;

a time diagram illustrating the time evolution of the clock voltage CK500;

a time diagram illustrating the time evolution of the voltage PwrGate404;

a time diagram illustrating the time evolution of a voltage VC1901 taken across the terminals of the capacitor C1901; and a time diagram illustrating the time evolution of the voltage Ton_dis1705.

Control voltage Ton_dis1705 is generated by the charging and discharging of the capacitor C1901. More particularly, a rising edge of the control voltage Ton_dis1705 is triggered by a rising edge of the clock voltage CK500, and a falling edge of the control voltage Ton_dis1705 is triggered by a voltage drop in the voltage across the capacitor C1901. More particularly, when the voltage VC1901 decreases and goes less than a limit voltage VC1901lim, the control voltage Ton_dis1705 has a falling edge.

To this end, the capacitor C1901 is charged on each rising edge of the clock voltage CK500, and discharged on each falling edge of the voltage PwrGate404, or on each falling edge of the clock voltage CK500.

Thus, the control voltage Ton_dis1705 is representative of a conduction phase of the power transistor 404.

Figure 21:
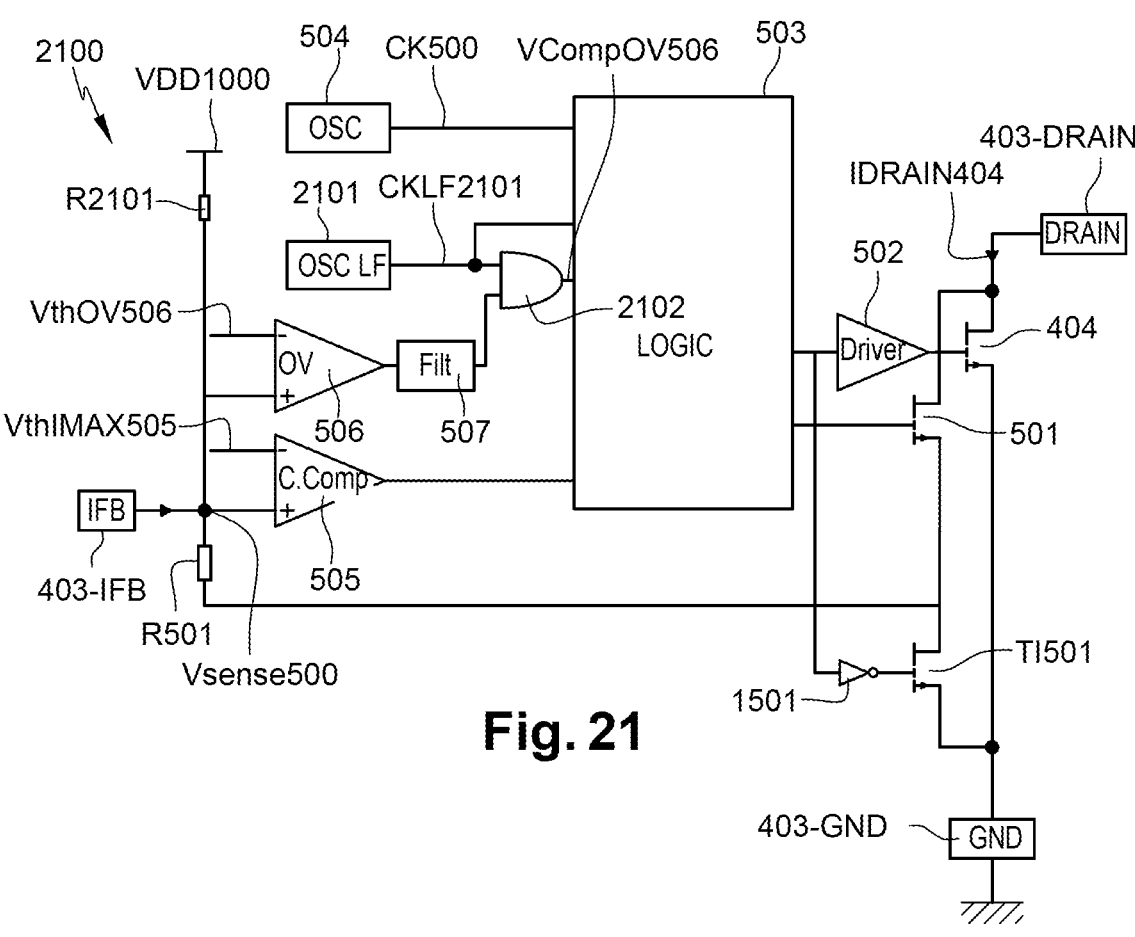
FIG. 21 illustrates an embodiment of a circuit for detecting a shorting at the output of the switched-mode power supply including the embodiment of FIG. 5.

FIG. 21 illustrates an embodiment of a detection circuit 2100 for detecting a short-circuit at the output of the switched-mode power supply 400 of FIG. 4, i.e., a short-circuit between the nodes OUT401 and OUT402. Circuit 2100 is also referred to as circuit for detecting an output short-circuit.

As explained in relation with FIG. 5, the control circuit 500 of the power transistor 404 includes the comparator circuit 506 and the filtering circuit 507, both of which allow a short-circuit in the output of the switched-mode power supply, i.e., a short-circuit between the nodes OUT401 and OUT402, to be detected. An output short-circuit results in a decreasing output voltage Vout, and therefore in a decrease in the feedback current IFB7400. Indeed, as previously mentioned, the Image of the output voltage of the switched-mode power supply is given by the feedback current IFB400.

Detection circuit 2100 includes the comparator circuit 506 and the filtering circuit 507. The comparator circuit 506 is of the type of the circuit 505, for example of the type of the comparator circuit 900 described in detail in relation with FIG. 9. Filtering circuit 507 is of the type of the filtering circuit 1700 described in relation with FIGS. 17 to 20.

As previously mentioned, the comparator circuit 506 (OV) includes a non-inverting input terminal (+) coupled to the terminal 403-IFB, and an inverting input terminal (−) receiving the threshold voltage VthOV506. According to one embodiment, the threshold voltage VthOV506 is lower than the threshold voltage VthIMAX505. The comparator circuit 506 outputs a voltage to the filtering circuit 507. Comparator circuit 506 allows a decrease in the feedback current IFB400 to be detected.

The filtering circuit 507 takes into account the result of the comparator circuit 506 only when the power transistor 403 is in an open state, i.e., a non-conductive state.

Detection circuit 2100 further includes a low-frequency oscillating circuit 2101. The circuit 2101 outputs a voltage CKLF2101. The circuit 2101 can supply the voltage CKLF2101 to the logic circuit 503. An embodiment of the circuit 2101 is described in relation with FIG. 23.

Detection circuit 2100 further includes an AND-type logic gate 2102 with two input terminals and one output terminal. A first input terminal of the logic gate 2102 is coupled with, preferably connected to, an output of the filtering circuit 507. A second input terminal of the logic gate 2102 is coupled with, preferably connected to, the output terminal of the circuit 2101, and thus receives the voltage CKLF2101. The output terminal of the logic gate 2102 delivers the comparison voltage VCompOV506 to the logic circuit 503 (LOGIC).

Figure 22:
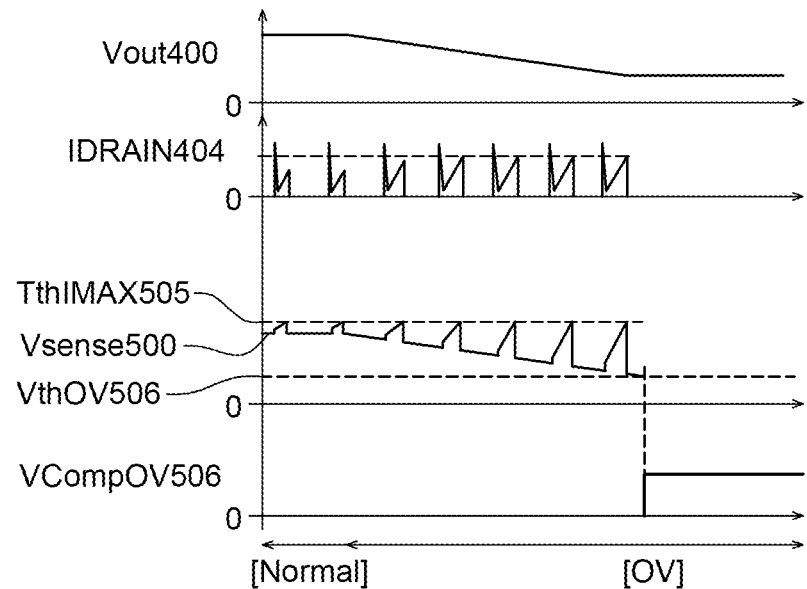
FIG. 22 illustrates time diagrams representing the operation of the circuit for detecting an output shorting of FIG. 21.

Operation of this short-circuit detection is described in relation with FIG. 22.

FIG. 22 illustrates time diagrams illustrating the operation of the circuit 2100 for detecting output short-circuit of FIG. 21.

More particularly, FIG. 22 illustrates the following time diagrams:

a time diagram illustrating the time evolution of the output voltage Vout400 of the switched-mode power supply including the power switch 403;

a time diagram illustrating the time evolution of the current IDRAIN404;

a time diagram illustrating the time evolution of the voltage Vsense500; and a time diagram illustrating the time evolution of the voltage VCompOV506.

FIG. 22 illustrates two cases, the case [Normal] during which the switched-mode power supply operates normally, and during which the voltage Vout400 is constant, and a case [OV] during which a short-circuit is detected at the output, and during which the voltage Vout400 decreases.

As the voltage Vout400 decreases, the feedback current IFB400 also decreases, and its image, the voltage Vsense500, decreases accordingly. The voltage Vsense500 decreases until it reaches the threshold voltage VthOV506. The comparison voltage VCompOV506 then detects the voltage drop in the voltage Vsense500, and the conduction cycles of the power transistor 404 are interrupted.

FIG. 23 illustrates an oscillating circuit 2300 which can be used as the oscillating circuit of the embodiment of the circuit 2100 described in relation with FIG. 21.

FIG. 23 illustrates the comparator 506, the filtering circuit 507, the logic circuit 503, the logic gate 2102, and the circuit 2300 hereinafter described.

Circuit 2300 includes a comparator circuit 2301 of the type of the comparator circuits 505, 506, and 508 of FIG. 5, and for example of the type of the comparator circuit 900 described in detail in relation with FIG. 9. The comparator circuit 2301 includes a non-inverting input terminal and an inverting input terminal. The comparator circuit 2301 further includes an output terminal delivering the voltage CKLF2101, and being coupled with, preferably connected to, the logic circuit 503.

Circuit 2300 further includes an inverter circuit 2302. The inverter circuit 2302 includes an input terminal receiving the voltage CKLF2101, and an output terminal coupled with, preferably connected to, an input terminal of the logic gate 2102.

Circuit 2300 further includes a first voltage divider bridge including a resistor R2301, a resistor R2302, and a resistor R2303. The first voltage divider bridge is coupled to the inverting input terminal of the comparator circuit 2301. A first terminal of the resistor R2301 is coupled with, preferably connected to, a node providing a supply voltage VDD2300, and a second terminal of the resistor R2301 is coupled with, preferably connected to, the inverting input terminal of the comparator circuit 2301. A first terminal of the resistor R2302 is coupled with, preferably connected to, the inverting input terminal of the comparator circuit 2301, and a second terminal of the resistor R2302 is coupled with, preferably connected to, a first terminal of the resistor R2303. A second terminal of the resistor R2303 is coupled with, preferably connected to, the terminal 403-GND.

Circuit 2300 further includes a resistor R2304 and a resistor R2305. Resistors R2304 and R2305 are pull-up resistors. More specifically, the resistor R2304 is a pull-up resistor, and the resistor R2305 is a pull-down resistor. For this reason, the value of the resistor R2304 is higher than the value of the resistor R2305. A first terminal of the resistor R2304 is coupled with, preferably connected to, the node supplying the supply voltage VDD2300, and a second terminal of the resistor R2304 is coupled with, preferably connected to, the non-inverting input terminal of the comparator circuit 2301. A first terminal of the resistor R2305 is coupled with, preferably connected to, the non-inverting input terminal of the comparator circuit 2301.

Circuit 2300 further includes two transistors, T2301 and T2302. Transistors T2301 and T2302 are both transistors of e-mode type. A first conduction terminal of the transistor T2301 is coupled with, preferably connected to, the middle node between the resistors R2302 and R2303, and a second conduction terminal of the transistor T2301 is coupled with, preferably connected to, the terminal 403-GND. A first conduction terminal of the transistor T2302 is coupled with, preferably connected to, a second terminal of the resistor R2305, and a second conduction terminal of the transistor T2301 is coupled with, preferably connected to, the terminal 403-GND. The gate terminals of the transistors T2301 and T2302 are coupled with, preferably connected to, the output terminal of the comparator circuit 2301.

Circuit 2300 further includes a capacitor 2301 including a first terminal coupled with, preferably connected to, the node supplying the supply voltage VDD2300 and a second terminal coupled with, preferably connected to, a terminal 403-Covld. The terminal 403-Covld is in turn coupled with, preferably connected to, the non-inverting terminal of the comparator circuit 2301.

Operation of the circuit 2300 is similar to the operation of the oscillating circuit 700 described in relation with FIGS. 7 and 8.

FIG. 24 illustrates time diagrams illustrating, in more detail, the operation of the short-circuit detection circuit 2100 described in relation with FIGS. 21 to 23. FIG. 24 illustrates, in more detail, the principle of power limitation related to the detection of an output short-circuit, as well as the associated restart attempts.

More particularly, FIG. 24 illustrates the following time diagrams:

> a time diagram illustrating the time evolution of the feedback current IFB400;
> a time diagram illustrating the time evolution of the voltage taken at the terminal 403-SS;
> a time diagram illustrating the time evolution of the voltage taken at the terminal 403-403-Covld;
> a time diagram illustrating the time evolution of the current IDRAIN404;
> a time diagram illustrating the time evolution of the output voltage VFilt207 of the filtering circuit 207;
> a time diagram illustrating the time evolution of the voltage CKLF2101; and
> a time diagram illustrating the time evolution of the voltage VCompOV506.

As previously mentioned, circuit 2100 monitors a current drop in the current IFB400, which corresponds to a voltage drop in the voltage Vsense500. The filtering circuit 207 allows the drops in the voltage Vsense500 occurring during a non-conduction phase of the power transistor 404 not to be taken into account. The low-frequency oscillating circuit 2101 allows the duration of a non-conduction phase of the power transistor 404 to be defined.

FIG. 25 illustrates a first example of the embodiment of a circuit 2500 for generating the threshold voltages used by the control circuit 500 described in relation with FIG. 5.

FIG. 25 illustrates the comparator circuits 505, 506, and 508, the power transistor 404, and the circuit 2500 hereinafter described.

Circuit 2500 is adapted to deliver the threshold voltages VthIMAX505, VthOP508, and VthOV206 used by the comparator circuits 505, 506, and 508.

Circuit 2500 includes two resistors R2501 and R2502. A first terminal of the resistor R2501 is coupled with, preferably connected to, the terminal 403-SS and is coupled with, preferably connected to, the inverting input terminal of the comparator circuit 508. A second terminal of the resistor R2501 is coupled with, preferably connected to, the inverting input terminal of the comparator circuit 505. A first terminal of the resistor R2502 is coupled with, preferably connected to, the inverting input terminal of the comparator circuit 505.

Circuit 2500 further includes two transistors of e-mode type T2501 and T2502. A first conduction terminal of the transistor T2501 is coupled with, preferably connected to, a second terminal of the resistor R2502, and a second conduction terminal of the transistor T2501 is coupled with, preferably connected to, the inverting input terminal of the comparator circuit 506. A first conduction terminal of the transistor T2502 is coupled with, preferably connected to, the inverting input terminal of the comparator circuit 506, and a second conduction terminal of the transistor T2502 is coupled with, preferably connected to, the terminal 403-GND, represented in FIG. 25 by ground. The control terminals of the transistors T2501 and T2502 are both coupled with, preferably connected to, a node providing a supply voltage VDD2500.

Circuit 2500 further includes a resistor R2503. A first terminal of the resistor R2503 is coupled with, preferably connected to, the terminal 403-SS. A second terminal of the resistor R2501 is coupled with, preferably connected to, the node delivering the supply voltage VDD2500.

FIG. 26 illustrates a second example embodiment of a circuit 2600 for generating the threshold voltages used by the control circuit 500 described in relation with FIG. 5.

FIG. 26 illustrates the comparator circuits 505, 506, and 508, the power transistor 404, and the circuit 2600 hereinafter described.

Circuit 2600 is adapted to provide the threshold voltages VthIMAX505, VthOP508, and VthOV206 used by the comparator circuits 505, 506, and 508.

Circuit 2600 includes all the elements of the circuit 2500 described in relation with FIG. 25. These elements are not described again here. Only the differences between the circuits 2500 and 2600 are highlighted.

Thus, circuit 2600 further includes a transistor T2601 of e-mode type, and a capacitor C2601. A first conduction terminal of the transistor T2601 is coupled with, preferably connected to, the terminal 403-SS. A second conduction terminal of the transistor T2601 is coupled with, preferably connected to, the terminal 403-GND, illustrated by ground in FIG. 26. A control terminal of the transistor T2601 is coupled with, preferably connected to, the output of the short-circuit detection circuit. In other words, the control terminal of the transistor 2601 receives the voltage VCompOV506. A first terminal of the capacitor C2601 is coupled with, preferably connected to, the terminal 403-SS, and a second terminal of the capacitor C2601 is coupled with, preferably connected to, the terminal 403-GND.

FIG. 27 illustrates an embodiment of a switched-mode power supply 2700 including an example embodiment of the power switch 403 described in relation with FIG. 4.

Switched-mode power supply 2700 includes an input node 2700IN and an output node 2700OUT.

As previously described, the power switch 403 includes a power transistor 404 and a control circuit 405 detailed in FIG. 27. As a reminder, the power switch 403 is formed in and on a structure of the type of the structure 100 described in relation with FIG. 1. The control circuit 405 includes elements already described, in which:

> the driving circuit 502;

the logic circuit 503;
the oscillating circuit 504;
the comparator circuits 505, 506, and 508;
the short-circuit detection circuit 2100; and
the transistor 501.

Control circuit 405 includes several connection terminals, in which:

the terminal 403-DRAIN (DRAIN);
the 403-GND terminal (GND);
a terminal TAB;
the terminal 403-IFB (IFB);
the terminal 403-SS (SS);
a terminal CLK_C;
a terminal CLK_R;
a terminal dV/dt_ctrl;
a terminal VDD;
a terminal DZ6V;
a terminal VCC; and
a terminal SUPPLY.

Control circuit 405 further includes the supply circuits 2701 (REG) and 2702 (VCC_SUP). The purpose of these circuits is to provide the supply voltage or voltages for the other circuits of the control circuit 405. According to an example, circuit 2702 is connected to the terminal SUPPLY. According to an example, the circuit 2701 is coupled with the circuit 2701, the terminal VCC, and the terminal DZ6V.

Control circuit 405 further includes a circuit 2703 (UV) for detecting a voltage drop in the supply voltage or voltages provided by the supply circuits 2701 and 2702. This circuit 2703 is, for example, coupled with the circuits 2701 and 2702, but also with the logic circuit 503.

Control circuit 405 further includes a circuit 2704 (OT) for detecting an overheating. According to an example, the detection circuit 2704 is coupled with, preferably connected to, the logic circuit 503.

Control circuit 405 further includes circuits 2705 for protecting against electrostatic discharges. Each circuit 2705 is associated with a connection terminal of the control circuit 403.

Those skilled in the art will be able to implement the circuits 2701, 2702, 2703, 2704, and 2705. As an example, example embodiments of some of these circuits are given in the French patent application numbered FR2210660.

Control circuit 405 further includes electronic components which, in FIG. 27, are not formed on a structure of the type of the structure 100 described in relation with FIG. 1. Some of these components, such as resistors and capacitors, could be formed on the same structure as the rest of the control circuit 405, but are not so formed here to allow the parameters of the switched-mode power supply 2700 to be more easily adapted.

Thus, the control circuit 405 includes a capacitor C2701, a first terminal of which is coupled with, preferably connected to, the input terminal 2700IN and the terminal SUPPLY of the control circuit 403. A second terminal of the capacitor C2701 receives a reference voltage.

Control circuit 405 further includes a Zener diode DZ2701. The cathode of the Zener diode DZ2701 is coupled with, preferably connected to, a terminal delivering a dedicated bias current to the Zener diode DZ2701. The anode of the Zener diode DZ2701 receives a reference voltage.

Control circuit 405 further includes a capacitor C2702, a first terminal of which is coupled with, preferably connected to, the terminal VDD. A second terminal of the capacitor C2702 receives a reference voltage.

Control circuit 405 further includes a resistor R2701 and a capacitor C2704. A first terminal of the resistor R2701 is coupled with, preferably connected to, the terminal VDD, and a second terminal of the resistor R2701 is coupled with, preferably connected to, a first terminal of the capacitor C2704 and the terminal 403-SS. A second terminal of the capacitor C2705 receives a reference voltage.

Control circuit 405 further includes a resistor R2702, a capacitor C2705, and a resistor R2703. A first terminal of the resistor R2702 is coupled with, preferably connected to, the terminal VDD, and a second terminal of the resistor R2702 is coupled with, preferably connected to, a first terminal of the capacitor C2705 and the terminal CLK_C. A second terminal of the capacitor C2705 receives a reference voltage. A first terminal of the resistor R2703 is coupled with, preferably connected to, the terminal CLK_R. A second terminal of the resistor R2703 is coupled with, preferably connected to, the terminal CLK_C.

Control circuit 405 further includes a resistor R2704, a first terminal of which is coupled with, preferably connected to, the terminal VDD. A second terminal of the resistor R2704 is coupled with, preferably connected to, the terminal dV/dt_ctrl.

Control circuit 405 further includes a resistor R2705, a first terminal of which is coupled with, preferably connected to, the terminal IFB. A second terminal of the resistor R2705 receives a reference voltage.

Switched-mode power supply 2700 further includes a transformer 2706 including an input coil and two output coils. A first terminal of the input coil is coupled with, preferably connected to, the input terminal 2700IN, and a second terminal of the input coil is coupled with, preferably connected to, the terminal 403-DRAIN. Both output coils comprise a first terminal receiving a reference voltage. A second terminal of a first output coil is coupled with the output node 2700OUT via a diode D2702 hereinafter described. A second terminal of a second output coil is coupled with the terminal VCC via a diode D2703 hereinafter described.

Switched-mode power supply 2700 further includes a Zener diode DZ2702 and a diode D2701 connected head-to-tail between the input terminal 2700IN and the terminal 403-DRAIN. More particularly, the anode of Zener diode DZ2702 is coupled with, preferably connected to, the input terminal 2700IN. The cathode of Zener diode DZ2702 is coupled with, preferably connected to, the cathode of the diode D2701. The anode of the diode D2701 is coupled with, preferably connected to, the terminal 403-DRAIN.

Switched-mode power supply 2700 further includes diodes D2702 and D2703, and a capacitor C2706. The anode of diode D2702 is coupled with, preferably connected to, the first output diode of the transformer 2706, and the cathode of diode D2702 is coupled with, preferably connected to, the output terminal 2700OUT. The anode of the diode D2703 is coupled with, preferably connected to, the second output diode of the transformer 2706, and the cathode of the diode D2703 is coupled with, preferably connected to, the terminal VCC. A first terminal of the capacitor C2706 is coupled with, preferably connected to, the terminal VCC, and a second terminal of the capacitor C2703 receives a reference voltage.

Switched-mode power supply 2700 further includes a resistor R2706, an optocoupler 2707 and a Zener diode DZ2703. The optocoupler 2707 includes a light-emitting diode DEL2707 and a bipolar opto-transistor OT2707. A first terminal of the resistor R2706 is coupled with, preferably connected to, the output terminal 2700OUT, and a second terminal of the resistor R2706 is coupled with, preferably connected to, the anode of the diode DEL2707.

The cathode of the diode DEL2707 is coupled with, preferably connected to, the cathode of Zener diode DZ2703. The anode of Zener diode DZ2703 receives a reference voltage. The collector of the transistor OT2707 is coupled with, preferably connected to, the terminal VDD, and the emitter of the transistor OT2707 is coupled with, preferably connected to, the terminal 403-IFB. The optocoupler 2707 forms the basic component of the feedback circuit 406 described in relation with FIG. 4.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

A pulse width modulation control circuit (405) of a switched-mode power supply (400) formed in and on a monolithic semiconductor substrate (101) with a face coated with a gallium nitride layer (102), may be summarized as being adapted to control a power transistor (404) of said switched-mode power supply (400).

The circuit may include a first comparator circuit (505) of a first voltage (Vsense500) representative of a drain current of said transistor, and of a feedback current (IFB400) of said switched-mode power supply.

Said first comparator circuit (505) may be adapted to cause said transistor (404) non-conductive if said first voltage (Vsense500) is higher than a first threshold voltage (VthIMAX505).

The circuit may further include a second comparator circuit (506) of said first voltage (Vsense500) representative of the drain current of said transistor (404) and of a feedback current (IFB400) of said switched-mode power supply.

Said second comparator circuit (506) may be adapted to cause said transistor (404) non-conductive if said first voltage (Vsense500) is lower than a second threshold voltage (VthOV506).

The circuit may further include a first filtering circuit (507) allowing a result of said second comparator circuit (506) to be taken into account only during a non-conduction phase of said power transistor (404).

The circuit may further include a third comparator circuit (508) of said first voltage (Vsense500) representative of the drain current of said transistor (404) and of a feedback current (IFB400) of said switched-mode power supply.

Said third comparator circuit (508) may be adapted to cause said transistor (404) non-conductive if said first voltage (Vsense500) is higher than a third threshold voltage (VthOP508).

The circuit may further include a second filtering circuit (509) allowing a result of said third comparator circuit (508) to be taken into account only during a non-conduction phase of said power transistor (404).

The circuit may further include an oscillating circuit (504) adapted to supply a clock voltage (CK500).

The circuit may further include a logic circuit (503) adapted to receive at least one clock voltage (CK500), and at least one comparison voltage (VCompIMAX505, VCompOV506, VCompOP508).

The circuit may further include a driving circuit (502) of said power transistor (404) adapted to receive a control voltage from said logic circuit (503).

A power switch (403; 500) may be summarized as including a power transistor (404) adapted to receive a maximum voltage of 650 V between its drain and its source, and a pulse width modulation circuit (405).

Said power transistor may be a transistor (404) of the HEMT type of e-mode type.

A switched-mode power supply (400; 2700) may be summarized as including the power switch (403; 500).

A circuit for detecting a shorting (2100) of a switched-mode power supply (400) may be summarized as including being formed in and on a monolithic semiconductor substrate (101) with a face coated with a gallium nitride layer (102), said circuit being adapted to control a power transistor (404) and of said switched-mode power supply (400).

The circuit may include a comparator circuit (506) of a first voltage (Vsense500) representative of a drain current of said transistor (404) and of a feedback current (IFB400) of said switched-mode power supply (400).

Said comparator circuit (506) may be adapted to cause said transistor (404) non-conductive if said first voltage (Vsense500) is lower than a second threshold voltage (VthOV506).

The circuit may further include a first filter circuit (507) allowing a result of said second comparator circuit (506) to be taken into account only during a non-conduction phase of said power transistor (404).

The circuit may further include an oscillating circuit (2101) adapted to supply a low frequency clock voltage.

A pulse width modulation circuit (405) may be summarized as including a circuit for detecting a shorting (2100).

The circuit may further include a logic circuit adapted to receive at least one comparison voltage supplied by said detection circuit (2100).

The circuit may further include a driving circuit (502) of said power transistor (404) adapted to receive a control voltage from said logic circuit (503).

A power switch (403; 500) may be summarized as including a power transistor (404) adapted to receive a maximum voltage of 650 V between its drain and its source, and a pulse width modulation circuit (405) according to claims 6.

Said power transistor may be a transistor (404) of the HEMT type of the e-mode type.

A switched-mode power supply (400; 2700) may be summarized as including the power switch (403; 500).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
a switched-mode power supply;
a pulse width modulation (PWM) control circuit in the switched-mode power supply, the PWM control circuit including:
a first comparator circuit configured to receive a first voltage and to output a first result; and
a second comparator circuit configured to receive the first voltage and to output a second result;

a monolithic semiconductor substrate with a face coated with a gallium nitride layer, the PWM control circuit formed on the monolithic semiconductor substrate; and a power transistor, the PWM control circuit configured to control the power transistor, wherein the first voltage is representative of a drain current of the power transistor, the first result is configured to cause the power transistor to be non-conductive when the first voltage is higher than a first threshold voltage, and the second result is configured to cause the power transistor to be non-conductive when the first voltage is lower than a second threshold voltage.

2. The device according to claim 1, wherein the first comparator circuit is configured to receive a feedback current of the switched-mode power supply.

3. The device according to claim 2, wherein the second comparator circuit is configured to receive the feedback current of the switched-mode power supply.

4. The device according to claim 3, wherein the PWM control circuit further includes:

a first filtering circuit configured to allow the second result of the second comparator circuit to be taken into account only during a non-conduction phase of the power transistor.

5. The device according to claim 4, wherein the PWM control circuit further includes:

a third comparator circuit configured to receive the first voltage representative of the drain current of the power transistor and the feedback current of the switched-mode power supply, the third comparator circuit configured to output a third result.

6. The device according to claim 5, wherein the third result is configured to cause the power transistor to be non-conductive if the first voltage is higher than a third threshold voltage.

7. The device according to claim 6, wherein the PWM control circuit further includes:

a second filtering circuit allowing the third result of the third comparator circuit to be taken into account only during the non-conduction phase of the power transistor.

8. The circuit according to claim 7, wherein the PWM control circuit further includes:

an oscillating circuit configured to supply a clock voltage.

9. The circuit according to claim 8, wherein the PWM control circuit further includes:

a logic circuit configured to receive the clock voltage, and at least one comparison voltage, the at least one comparison voltage being any from the group of the first result, the second result, and the third result.

10. The device according to claim 9, wherein the PWM control circuit further includes:

a driving circuit of the power transistor configured to receive a control voltage from the logic circuit.

11. The device according to claim 4, wherein the PWM control circuit further includes a second filtering circuit configured to allow the first result of the first comparator circuit to be taken into account only during the non-conduction phase of the power transistor.

12. A method, comprising:

controlling a monolithic switched-mode power supply, by:

detecting a feedback current constituting an image of an output voltage of the switched-mode power supply;

generating a sensing voltage according to the feedback current;

generating a first result by comparing the sensing voltage with a first reference voltage;

generating a second result by comparing the sensing voltage with a second reference voltage;

generating a third result by comparing the sensing voltage with a third reference voltage;

combining the first, the second, and the third result by a logic circuit;

driving a power transistor of the switched-mode power supply with the logic circuit;

filtering the first result with a first filter circuit, the first filter circuit configure to allow the first result to be taken into account only during a non-conduction phase of the power transistor; and filtering the second result with a second filter circuit, the second filter circuit configure to allow the second result to be taken into account only during the non-conduction phase of the power transistor.

13. The method of claim 12, further comprising:

switching off the power transistor if the sensing voltage is higher than the third reference voltage.

14. A device comprising:

a power transistor having a drain terminal and a gate terminal;

a monolithic structure including:

a semiconductor substrate; and a gallium nitride layer;

an output terminal coupled to the drain terminal of the power transistor; and a control circuit on the monolithic structure, the control circuit coupled to the gate terminal of the power transistor, the control circuit configured to switch on and off a current through the power transistor, the control circuit including:

a logic circuit configured to switch on and off the current flow through the power transistor, the logic circuit including:

a NOR gate having a plurality of inputs and an output; and an OR gate having a plurality of inputs and an output.

15. The device of claim 14, wherein the control circuit is further configured to sense an output voltage at the output terminal.

16. The device of claim 15, wherein the logic circuit includes:

a clock input;

an RS flip-flop having an R terminal, a S terminal, and a Q terminal, the Q terminal coupled to the gate terminal of the power transistor, the R terminal coupled to the output of the OR gate; and an AND gate having a first input coupled to the output of the NOR gate, a second input coupled to the clock input, and an output coupled to the S terminal of the RS flip-flop.

17. The device of claim 16, wherein the control circuit further includes:

an oscillator circuit configured to generate a periodic signal at an oscillator output, the oscillator output coupled to the clock input, the oscillator circuit including:

a comparator having an input, an inverse input, and an output; and a delay element having a delay input and a delayed output, the delayed output coupled to the oscillator output, the comparator inverse input, and the comparator input.

18. The device of claim 16, wherein the control circuit further includes:

a first comparator having a first input configured to sense the output voltage, a first inverse input configured to receive a first threshold voltage, and a first output coupled to a plurality of stop inputs of the logic circuit;

a second comparator having a second inverse input configured to sense the output voltage, a second input configured to receive a second threshold voltage, and a second output coupled to the plurality of start inputs of the logic circuit; and a third comparator having a third inverse input configured to sense the output voltage, a third input configured to receive a third threshold voltage, and a third output coupled to the plurality of start inputs of the logic circuit.

19. The device of claim 18, further comprising:

an input terminal configured to receive an input voltage;

a first diode having an anode coupled to the drain terminal of the power transistor, and a cathode; and a Zener diode having a cathode coupled to the cathode of the first diode, and an anode coupled to the input terminal.

* * * * *